US 9,407,217 B2

(12) United States Patent
Kagano et al.

(10) Patent No.: US 9,407,217 B2
(45) Date of Patent: Aug. 2, 2016

(54) AMPLIFIER AND SIGNAL PROCESSING DEVICE

(75) Inventors: Miki Kagano, Tokyo (JP); Kazuya Makabe, Tokyo (JP); Tomokazu Ogomi, Tokyo (JP); Takahito Nakanishi, Tokyo (JP); Tadashi Minobe, Tokyo (JP); Takashi Ito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 314 days.

(21) Appl. No.: 14/119,573

(22) PCT Filed: Jun. 12, 2012

(86) PCT No.: PCT/JP2012/065006
§ 371 (c)(1),
(2), (4) Date: Nov. 22, 2013

(87) PCT Pub. No.: WO2012/173112
PCT Pub. Date: Dec. 20, 2012

(65) Prior Publication Data
US 2014/0197828 A1    Jul. 17, 2014

(30) Foreign Application Priority Data

Jun. 17, 2011   (JP) .................................. 2011-135380
Jul. 11, 2011   (JP) .................................. 2011-153021
Apr. 4, 2012    (JP) .................................. 2012-085700

(51) Int. Cl.
*G01B 7/14*     (2006.01)
*H03F 3/45*     (2006.01)
(Continued)

(52) U.S. Cl.
CPC .................. *H03F 3/45* (2013.01); *G01D 5/145* (2013.01); *G01R 33/09* (2013.01);
(Continued)

(58) Field of Classification Search
CPC ..... G01D 5/24476; G01D 5/145; G01B 7/14; G01V 3/10
USPC ..................................................... 324/207.22
See application file for complete search history.

(56) References Cited

U.S. PATENT DOCUMENTS 5,541,508 A   7/1996 Suzuki
5,783,951 A   7/1998 Inoue et al.
(Continued)

FOREIGN PATENT DOCUMENTS

CN     101106357 A    1/2008
EP     1 879 290 A2   1/2008
(Continued)

OTHER PUBLICATIONS

International Search Report Issued Sep. 4, 2012 in PCT/JP12/065006 Filed Jun. 12, 2012.
(Continued)

*Primary Examiner* — Reena Aurora
(74) *Attorney, Agent, or Firm* — Oblon, McClelland, Maier & Neustadt, L.L.P.

(57) ABSTRACT

When a switch is set to off, and a switch is set to on, the voltage of a SigOut terminal is stabilized with a reference voltage, and a bias voltage is applied to a capacitor. Changing the switch from on to off, with the bias voltage retained in the capacitor, a detection signal which is input via a SigIn terminal is amplified with the reference voltage as a reference, and an amplified signal is output from the SigOut terminal.

12 Claims, 25 Drawing Sheets

(51) Int. Cl.
  *G01D 5/14* (2006.01)
  *G01R 33/09* (2006.01)

(52) U.S. Cl.
  CPC ....... *H03F 3/45179* (2013.01); *H03F 3/45475* (2013.01); *H03F 2200/411* (2013.01); *H03F 2200/78* (2013.01); *H03F 2203/45512* (2013.01); *H03F 2203/45514* (2013.01); *H03F 2203/45521* (2013.01); *H03F 2203/45528* (2013.01); *H03F 2203/45534* (2013.01); *H03F 2203/45536* (2013.01); *H03F 2203/45594* (2013.01); *H03F 2203/45728* (2013.01)

(56) References Cited

U.S. PATENT DOCUMENTS

| | | | |
|---|---|---|---|
| 6,023,193 A | 2/2000 | Ierymenko | |
| 6,208,482 B1 | 3/2001 | Araya et al. | |
| 6,211,736 B1 | 4/2001 | Takeuchi et al. | |
| 6,297,627 B1 * | 10/2001 | Towne et al. | H03G 3/00 324/207.2 |
| 8,139,792 B2 * | 3/2012 | Magrath | H03F 1/305 381/120 |
| 2007/0096825 A1 | 5/2007 | Okuyama | |
| 2010/0007420 A1 * | 1/2010 | Nishimura et al. | H03F 3/45 330/260 |

FOREIGN PATENT DOCUMENTS

| | | |
|---|---|---|
| JP | 61-28206 A | 2/1986 |
| JP | 4 69986 | 3/1992 |
| JP | 5 94569 | 4/1993 |
| JP | 5 85060 | 11/1993 |
| JP | 6 313718 | 11/1994 |
| JP | 7 287802 | 10/1995 |
| JP | 9 107246 | 4/1997 |
| JP | 11-205632 A | 7/1999 |
| JP | 2000 162296 | 6/2000 |
| JP | 2000 195003 | 7/2000 |
| JP | 2001 16052 | 1/2001 |
| JP | 2001 84041 | 3/2001 |
| JP | 2007 33270 | 2/2007 |
| JP | 2007 124494 | 5/2007 |
| JP | 2010 223862 | 10/2010 |

OTHER PUBLICATIONS

Extended European Search Report issued Apr. 2, 2015 in Patent Application No. 12800837.2.
Office Action issued Apr. 23, 2015 in Canadian Patent Application No. 2,833,248.
Combined Chinese Office Action and Search Report issued Dec. 2, 2015 in Patent Application No. 201280029737.5 (with English language translation and English translation of categories of cited documents).
Office Action issued Feb. 16, 2016 in Japanese Patent Application No. 2012-085700 (with English language translation).
Office Action issued Feb. 18, 2016 in Korean Patent Application No. 10-2013-7032150 (with partial English language translation).

\* cited by examiner

FIG.6

| MODE | STEP | CHANNEL AMPLIFIER ||||  OUTPUT AMPLIFIER ||||
| | | SWITCH STATE ||| REFERENCE VOLTAGE | SWITCH STATE ||| REFERENCE VOLTAGE |
| | | SW1 (NOM) | SW2 (SER) | SW3 (CLA) | | SW1 (NOM) | SW2 (SER) | SW3 (CLA) | |
|---|---|---|---|---|---|---|---|---|---|
| NORMAL | S1 | ON (H) | OFF (L) | OFF (L) | 2.25 V | ON (H) | OFF (L) | OFF (L) | 2.25 V |
| | S2, S3 | OFF (L) | OFF (L) | OFF→ON (L)→(H) | 1.65 V | OFF (L) | OFF (L) | OFF→ON (L)→(H) | 1.65 V |
| | S4 | OFF (L) | OFF (L) | ON→OFF (H)→(L) | 1.65 V | OFF (L) | OFF (L) | ON→OFF (H)→(L) | 1.65 V |
| | S5-S9 | OFF (L) | OFF (L) | OFF (L) | 1.65 V | OFF (L) | OFF (L) | OFF (L) | 1.65 V |
| HIGH SPEED | S2', S3' | OFF (L) | ON (H) | OFF→ON (L)→(H) | 1.65 V | OFF (L) | OFF (L) | OFF→ON (L)→(H) | 1.65 V |
| | S4' | OFF (L) | ON (H) | ON→OFF (H)→(L) | 1.65 V | OFF (L) | OFF (L) | ON→OFF (H)→(L) | 1.65 V |
| | S5'-S9' | OFF (L) | ON (H) | OFF (L) | 1.65 V | OFF (L) | OFF (L) | OFF (L) | 1.65 V |

FIG.7
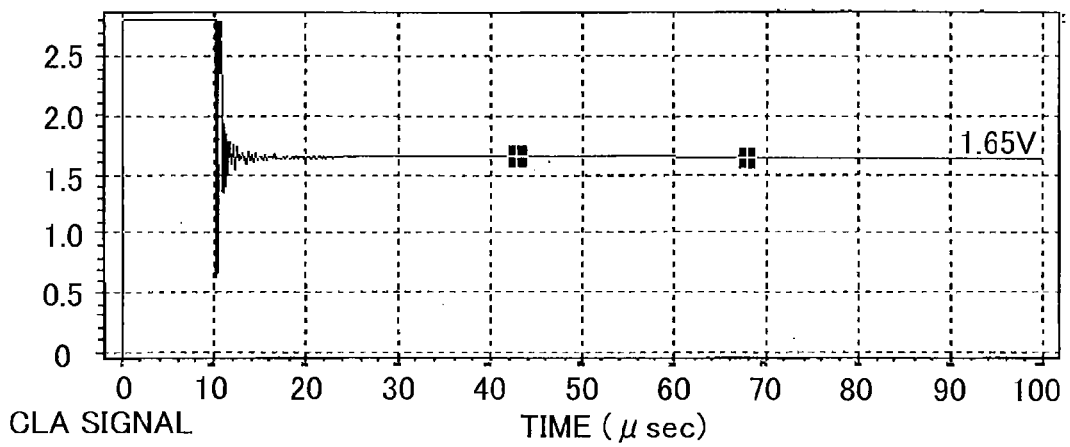
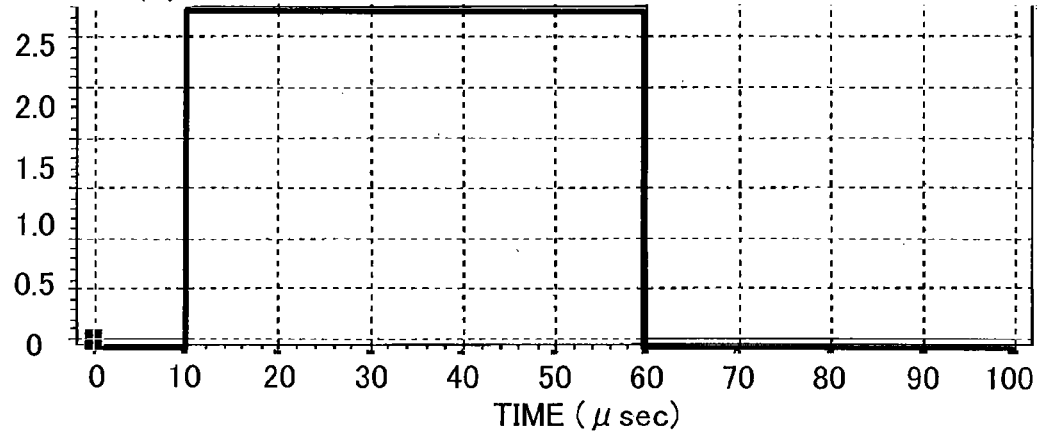

FIG.15

| GAIN DISTRIBUTION PATTERN | CHANNEL AMPLIFIER | | OUTPUT AMPLIFIER | | DIFFERENTIAL AMPLIFIER GAIN (MULTIPLE) | TOTAL GAIN (MULTIPLE) | VARIANCE IN MIDPOINT VOLTAGE OF DIFFERENTIAL AMPLIFIER OUTPUT (mV) |
|---|---|---|---|---|---|---|---|
| | GAIN (MULTIPLE) | Op3 DC OFFSET (mV) | GAIN (MULTIPLE) | Op3 DC OFFSET (mV) | | | |
| PATTERN 1 | 10 | 4 | 10 | 4 | 10 | 1000 | 440 |
| PATTERN 2 | 20 | 4 | 20 | 4 | 2.5 | 1000 | 210 |
| PATTERN 3 | 40 | 4 | 10 | 4 | 2.5 | 1000 | 110 |

FIG.17

| MODE | STEP | CHANNEL AMPLIFIER ||||| OUTPUT AMPLIFIER |||
| --- | --- | --- | --- | --- | --- | --- | --- | --- | --- |
| | | SWITCH STATE |||| REFERENCE VOLTAGE | SWITCH STATE || REFERENCE VOLTAGE |
| | | SW1 (NOM) | SW4 (NOM2) | SW3 (NOM2B) | SW2 (CLA) | | SW1 (NOM) | SW2 (CLA) | |
| NORMAL | S1 | ANY | ON (H) | OFF (L) | OFF (L) | 2.25 V | ON (H) | OFF (L) | 2.25 V |
| | S2, S3 | OFF (L) | OFF (L) | ON (H) | OFF→ON (L)→(H) | 1.65 V | OFF (L) | OFF→ON (L)→(H) | 1.65 V |
| | S4 | OFF (L) | OFF (L) | ON (H) | ON→OFF (H)→(L) | 1.65 V | OFF (L) | ON→OFF (H)→(L) | 1.65 V |
| | S5-S9 | OFF (L) | OFF (L) | ON (H) | OFF (L) | 1.65 V | OFF (L) | OFF (L) | 1.65 V |
| HIGH SPEED | S2', S3' | OFF (L) | OFF (L) | ON (H) | OFF→ON (L)→(H) | 1.65 V | OFF (L) | OFF→ON (L)→(H) | 1.65 V |
| | S4' | OFF (L) | OFF (L) | ON (H) | ON→OFF (H)→(L) | 1.65 V | OFF (L) | ON→OFF (H)→(L) | 1.65 V |
| | S5'-S9' | OFF (L) | OFF (L) | ON (H) | OFF (L) | 1.65 V | OFF (L) | OFF (L) | 1.65 V |

FIG.19

| MODE | STEP | CHANNEL AMPLIFIER | | | | | | OUTPUT AMPLIFIER | | | |
|---|---|---|---|---|---|---|---|---|---|---|---|
| | | SWITCH STATE | | | | | REFERENCE VOLTAGE | SWITCH STATE | | | REFERENCE VOLTAGE |
| | | SW1 (NOM) | SW5 (NOM2) | SW4 (NOM2B) | SW2 (SER) | SW3 (CLA) | | SW1 (NOM) | SW2 (SER) | SW3 (CLA) | |
| NORMAL | S1 | ANY | ON (H) | OFF (L) | OFF (L) | OFF (L) | 2.25 V | ON (H) | OFF (L) | OFF (L) | 2.25 V |
| | S2, S3 | OFF (L) | OFF (L) | ON (H) | OFF (L) | OFF→ON (L)→(H) | 1.65 V | OFF (L) | OFF (L) | OFF→ON (L)→(H) | 1.65 V |
| | S4 | OFF (L) | OFF (L) | ON (H) | OFF (L) | ON→OFF (H)→(L) | 1.65 V | OFF (L) | OFF (L) | ON→OFF (H)→(L) | 1.65 V |
| | S5–S9 | OFF (L) | OFF (L) | ON (H) | OFF (L) | OFF (L) | 1.65 V | OFF (L) | OFF (L) | OFF (L) | 1.65 V |
| HIGH SPEED | S2', S3' | OFF (L) | OFF (L) | ON (H) | ON (H) | OFF→ON (L)→(H) | 1.65 V | OFF (L) | OFF (L) | OFF→ON (L)→(H) | 1.65 V |
| | S4' | OFF (L) | OFF (L) | ON (H) | ON (H) | ON→OFF (H)→(L) | 1.65 V | OFF (L) | OFF (L) | ON→OFF (H)→(L) | 1.65 V |
| | S5'–S9' | OFF (L) | OFF (L) | ON (H) | ON (H) | OFF (L) | 1.65 V | OFF (L) | OFF (L) | OFF (L) | 1.65 V |

FIG.25

| MODE | STEP | CHANNEL AMPLIFIER ||||  OUTPUT AMPLIFIER ||||
| | | SWITCH STATE |||REFERENCE VOLTAGE| SWITCH STATE |||REFERENCE VOLTAGE|
| | | SW1 (NOM) | SW2 (SER) | SW3 (CLA) | | SW1 (NOM) | SW2 (SER) | SW3 (CLA) | |
|---|---|---|---|---|---|---|---|---|---|
| NORMAL | S1 | ON (H) | OFF (L) | OFF (L) | 2.25 V | ON (H) | OFF (L) | OFF (L) | 2.25 V |
| | S2, S3 | OFF (L) | OFF (L) | OFF→ON (L)→(H) | 1.65 V | ON (H) | OFF (L) | OFF (L) | 1.65 V |
| | S4 | OFF (L) | OFF (L) | ON→OFF (H)→(L) | 1.65 V | ON (H) | OFF (L) | OFF (L) | 1.65 V |
| | S5-S9 | OFF (L) | OFF (L) | OFF (L) | 1.65 V | ON (H) | OFF (L) | OFF (L) | 1.65 V |
| HIGH SPEED | S2', S3' | OFF (L) | ON (H) | OFF→ON (L)→(H) | 1.65 V | ON (H) | OFF (L) | OFF (L) | 1.65 V |
| | S4' | OFF (L) | ON (H) | ON→OFF (H)→(L) | 1.65 V | ON (H) | OFF (L) | OFF (L) | 1.65 V |
| | S5'-S9' | OFF (L) | ON (H) | OFF (L) | 1.65 V | ON (H) | OFF (L) | OFF (L) | 1.65 V |

FIG.26

| MODE | STEP | CHANNEL AMPLIFIER | | | | | OUTPUT AMPLIFIER | | |
|---|---|---|---|---|---|---|---|---|---|
| | | SWITCH STATE | | | | REFERENCE VOLTAGE | SWITCH STATE | | REFERENCE VOLTAGE |
| | | SW1 (NOM) | SW4 (NOM2) | SW3 (NOM2B) | SW2 (CLA) | | SW1 (NOM) | SW2 (CLA) | |
| NORMAL | S1 | ANY | ON (H) | OFF (L) | OFF (L) | 2.25 V | ON (H) | OFF (L) | 2.25 V |
| | S2, S3 | OFF (L) | OFF (L) | ON (H) | OFF→ON (L)→(H) | 1.65 V | ON (H) | OFF (L) | 1.65 V |
| | S4 | OFF (L) | OFF (L) | ON (H) | ON→OFF (H)→(L) | 1.65 V | ON (H) | OFF (L) | 1.65 V |
| | S5-S9 | OFF (L) | OFF (L) | ON (H) | OFF (L) | 1.65 V | ON (H) | OFF (L) | 1.65 V |
| HIGH SPEED | S2', S3' | OFF (L) | OFF (L) | ON (H) | OFF→ON (L)→(H) | 1.65 V | ON (H) | OFF (L) | 1.65 V |
| | S4' | OFF (L) | OFF (L) | ON (H) | ON→OFF (H)→(L) | 1.65 V | ON (H) | OFF (L) | 1.65 V |
| | S5'-S9' | OFF (L) | OFF (L) | ON (H) | OFF (L) | 1.65 V | ON (H) | OFF (L) | 1.65 V |

FIG.27

| MODE | STEP | CHANNEL AMPLIFIER | | | | | | OUTPUT AMPLIFIER | | | |
|---|---|---|---|---|---|---|---|---|---|---|---|
| | | SWITCH STATE | | | | | REFERENCE VOLTAGE | SWITCH STATE | | | REFERENCE VOLTAGE |
| | | SW1 (NOM) | SW5 (NOM2) | SW4 (NOM2B) | SW2 (SER) | SW3 (CLA) | | SW1 (NOM) | SW2 (SER) | SW3 (CLA) | |
| NORMAL | S1 | ANY | ON (H) | OFF (L) | OFF (L) | OFF (L) | 2.25 V | ON (H) | OFF (L) | OFF (L) | 2.25 V |
| | S2, S3 | OFF (L) | OFF (L) | ON (H) | OFF (L) | OFF→ON (L)→(H) | 1.65 V | ON (H) | OFF (L) | OFF (L) | 1.65 V |
| | S4 | OFF (L) | OFF (L) | ON (H) | OFF (L) | ON→OFF (H)→(L) | 1.65 V | ON (H) | OFF (L) | OFF (L) | 1.65 V |
| | S5–S9 | OFF (L) | OFF (L) | ON (H) | OFF (L) | OFF (L) | 1.65 V | ON (H) | OFF (L) | OFF (L) | 1.65 V |
| HIGH SPEED | S2', S3' | OFF (L) | OFF (L) | ON (H) | ON (H) | OFF→ON (L)→(H) | 1.65 V | ON (H) | OFF (L) | OFF (L) | 1.65 V |
| | S4' | OFF (L) | OFF (L) | ON (H) | ON (H) | ON→OFF (H)→(L) | 1.65 V | ON (H) | OFF (L) | OFF (L) | 1.65 V |
| | S5'–S9' | OFF (L) | OFF (L) | ON (H) | ON (H) | OFF (L) | 1.65 V | ON (H) | OFF (L) | OFF (L) | 1.65 V |

AMPLIFIER AND SIGNAL PROCESSING DEVICE

TECHNICAL FIELD

The present invention is related to an amplifier and a signal processing device.

BACKGROUND ART

A magnetic sensor device is a sensor device for detecting magnetic patterns in a detectable body using a magnetic resistance effect element having the property that the resistance value changes under an impressed magnetic field. Because the degree of magnetization in a magnetic pattern possessed by paper money or other detectable body is low the change in resistance value of the magnetic resistance effect element is low. Accordingly, in a magnetic sensor device that uses bridge-connected magnetic resistance elements, the midpoint voltage produced from the midpoint of the bridge-connected magnetic resistance effect elements is low, so amplifying with a large gain such as 1000, for example, is necessary.

The midpoint voltage produced from the midpoint of the bridge-connected magnetic resistance effect elements fluctuates due to variations in individual magnetic resistance effect elements, fluctuations in power source voltage and also fluctuations in temperature. Consequently, then the midpoint voltage is amplified with a large gain, saturation of the amplifier can occur so a correct detected waveform is not obtained. With the art disclosed in Patent Literature 1 and 2, only the changed portion is amplified, omitting the direct-current portion. In addition, with the art disclosed in Patent Literature 3 through 6, only the changed portion is amplified, omitting the offset voltage.

CITATION LIST

Patent Literature

Patent Literature 1: Unexamined Japanese Utility Model Application Kokai Publication No. H05-085060
Patent Literature 2: Unexamined Japanese Patent Application Kokai Publication No. 2000-162296
Patent Literature 3: Unexamined Japanese Patent Application Kokai Publication No. 2010-223862
Patent Literature 4: Unexamined Japanese Patent Application Kokai Publication No. H7-287802
Patent Literature 5: Unexamined Japanese Patent Application Kokai Publication No. 2000-195003
Patent Literature 6: Unexamined Japanese Patent Application Kokai Publication No. 2001-16052

SUMMARY OF INVENTION

Technical Problem

For example, with the art disclosed in Patent Literature 1, the direct-current signal in the detected signal is removed using a high-pass filter in which a cutoff frequency is determined by electrostatic capacitance and resistance. However, when a low-frequency component is included in the detected signal, a capacitor having an electrostatic capacitance on the order of µF is necessary, so the signal process circuit becomes larger.

In consideration of the foregoing, it is an objective of the present invention to reduce the size of an amplifier and signal processing device capable of amplifying an input signal containing a low-frequency component.

Solution to Problem

To achieve the above objective, the amplifier of the present invention comprises a first resistor, a first operational amplifier, a second resistor, a second operational amplifier, a first capacitor, a first switch, a third resistor, a second switch and a control circuit. An input signal is input into the inverting input terminal of the first operational amplifier from a signal input terminal via the first resistor. One end of the second resistor is connected to the inverting input terminal of the first operational amplifier and the other end is connected to the output terminal of the first operational amplifier. A prescribed reference voltage is input into the non-inverting input terminal of the second operational amplifier and the output terminal of the second operational amplifier is connected to the non-inverting input terminal of the first operational amplifier. One end of the first capacitor is connected to the inverting input terminal of the second operational amplifier and the other end is connected to the output terminal of the second operational amplifier. One end of the first switch is connected to the inverting input terminal of the second operational amplifier and the other end is connected to the output terminal of the second operational amplifier. The third resistor and the second switch are connected in series, with one end being connected to the output terminal of the first operational amplifier and the other end being connected to the inverting input terminal of the second operational amplifier. The control circuit receives input of amp control signals and switches the first switch and the second switch on and off in a prescribed order based on the amp control signals. Through the switching process of the control circuit, the first operational amplifier amplifies the input signal with the reference voltage as a reference, and the amplified signal is output from a signal output terminal connected to the output terminal of the first operational amplifier.

Advantageous Effects of Invention

With the present invention, it is possible to reduce the size of an amplifier and signal processing device capable of amplifying an input signal containing a low-frequency component

BRIEF DESCRIPTION OF DRAWINGS

FIG. 6 is a state transition drawing for switches in the first preferred embodiment;
FIG. 7 is a drawing showing voltage waveforms at a midpoint voltage correction time of a SigOut terminal in the amplifier according to the first preferred embodiment;

FIG. 15 is a drawing showing the variance in midpoint voltage in a differential amplifier comprised in a signal processing device according to a second preferred embodiment of the present invention;

FIG. 17 is a state transition drawing for switches according to the third preferred embodiment;

FIG. 19 is a state transition drawing for switches according to the fourth preferred embodiment;

FIG. 25 is a state transition drawing for switches according to a ninth preferred embodiment of the present invention;

FIG. 26 is a state transition drawing for switches according to the ninth preferred embodiment; and FIG. 27 is a state transition drawing for switches according to the ninth preferred embodiment.

DESCRIPTION OF EMBODIMENTS

Figure 1:
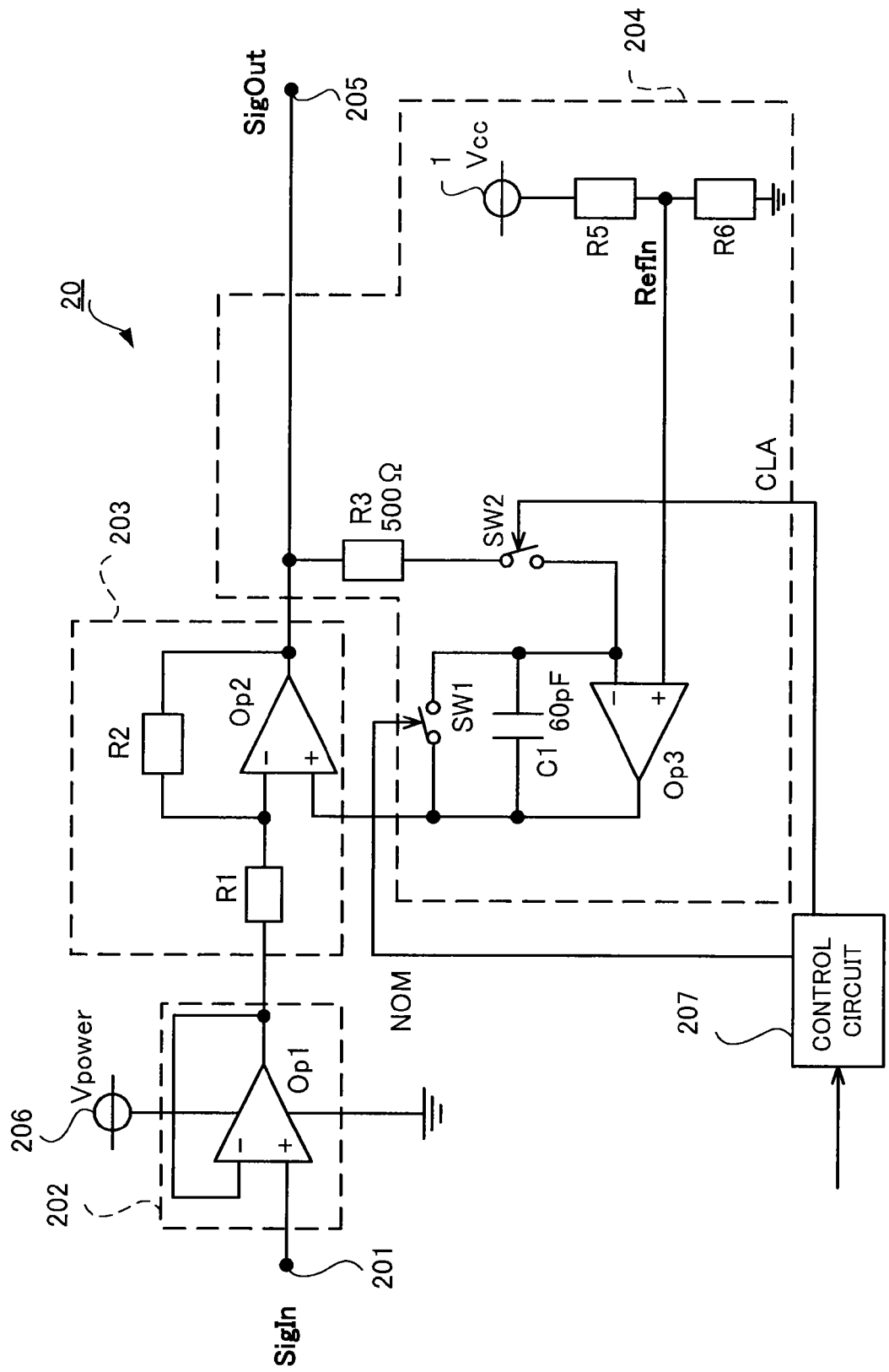
FIG. 1 is a drawing showing an exemplary composition of an amplifier according to a first preferred embodiment of the present invention.

Below, the preferred embodiments of the present invention are described in detail with reference to the drawings. In the drawings, parts that are the same or equivalent are labeled with the same reference signs.

First Preferred Embodiment

FIG. 1 is a drawing showing an exemplary composition of an amplifier according to a first preferred embodiment of the present invention. Using FIG. 1, the amplifier according to the first preferred embodiment of the present invention will be described for the principle of amplifying an input signal. An amplifier 20 comprises a voltage follower amp 202 comprising an operational amplifier (hereafter called "op-amp") Op1, an inverting amplifier 203, a DC feedback circuit 204 and a control circuit 207. An input signal is input from a SigIn terminal 201 that is a signal input terminal, and is input into the inverting amplifier 203 via the voltage follower amp 202. The electric potential of a non-inverting input terminal of an op-amp Op2 (first operational amplifier) with which the inverting amplifier 203 is provided is determined by the DC feedback circuit 204.

The inverting amplifier 203 is provided with a resistor R1 (first resistor), a resistor R2 (second resistor) and the op-amp Op2. The resistor R1 is positioned between the output terminal of the voltage follower amp 202 and the inverting input terminal of the op-amp Op2, and the resistor R2 is connected at one end to the inverting input terminal of the op-amp Op2 and at the other end to the output terminal of the op-amp Op2.

The DC feedback circuit 204 comprises an op-amp Op3 (second operational amplifier), a capacitor C1 (first capacitor), a switch SW1 (first switch), a resistor R3 (third resistor), a switch SW2 (second switch) and resistors R5 and R6. The resistor R3 and the switch SW2 are connected in series, with one end connected to the output terminal of the op-amp Op2 and the other end connected to the inverting input terminal of the op-amp Op3. A reference voltage that is the value of the voltage of a direct-current power source 1 divided by the resistor R5 and the resistor R6 (RefIn in the drawing) is input into the non-inverting input terminal of the op-amp Op3.

For example, suppose it is possible to change the respective resistance values of the resistors R5 and R6 through an unrepresented switch, using as the resistors R5 and R6 45 kΩ resistance made by connecting 90 500Ω resistors in series, connected in series. For example, in the case of case 1, the resistance value of the resistor R5 is 28.5 kΩ and the resistance value of the resistor R6 is 16.5 kΩ. In the case of case 2, the resistance value of the resistor R5 is 22.5 kΩ and the resistance value of the resistor R6 is 22.5 kΩ. Assuming the direct-current power source to be 4.5 V, the reference voltage in the case of case 1 is 1.65 V and the reference voltage in the case of case 2 is 2.25 V.

The capacitor 1 and the switch SW1 are each connected at one end to the inverting input terminal of the op-amp Op3 and at the other end to the output terminal of the op-amp Op3. The op-amps Op1, Op2 and Op3 are each connected to an IC power source 206. In FIG. 1, notation of the connection of the op-amps Op2 and Op3 to the IC power source 206 is omitted. The inverting amplifier 203 and the DC feedback circuit 204 form a DC clamp amp.

The control circuit 207 receives input of a NOM signal and a CLA signal that are amp control signals, and sends the NOM signal to the switch SW1 and the CLA signal to the switch SW2. The switches SW1 and SW2 change between on and off based on the signal level of the NOM signal and CLA signal, respectively. Through the switching process of the control circuit 207, the on and off settings of the switches SW1 and SW2 are switched with a prescribed order, and through this the input signal is amplified in the op-amp Op2 and the amplified signal is output via the SigOut terminal 205, which is a signal output terminal.

Figure 2:
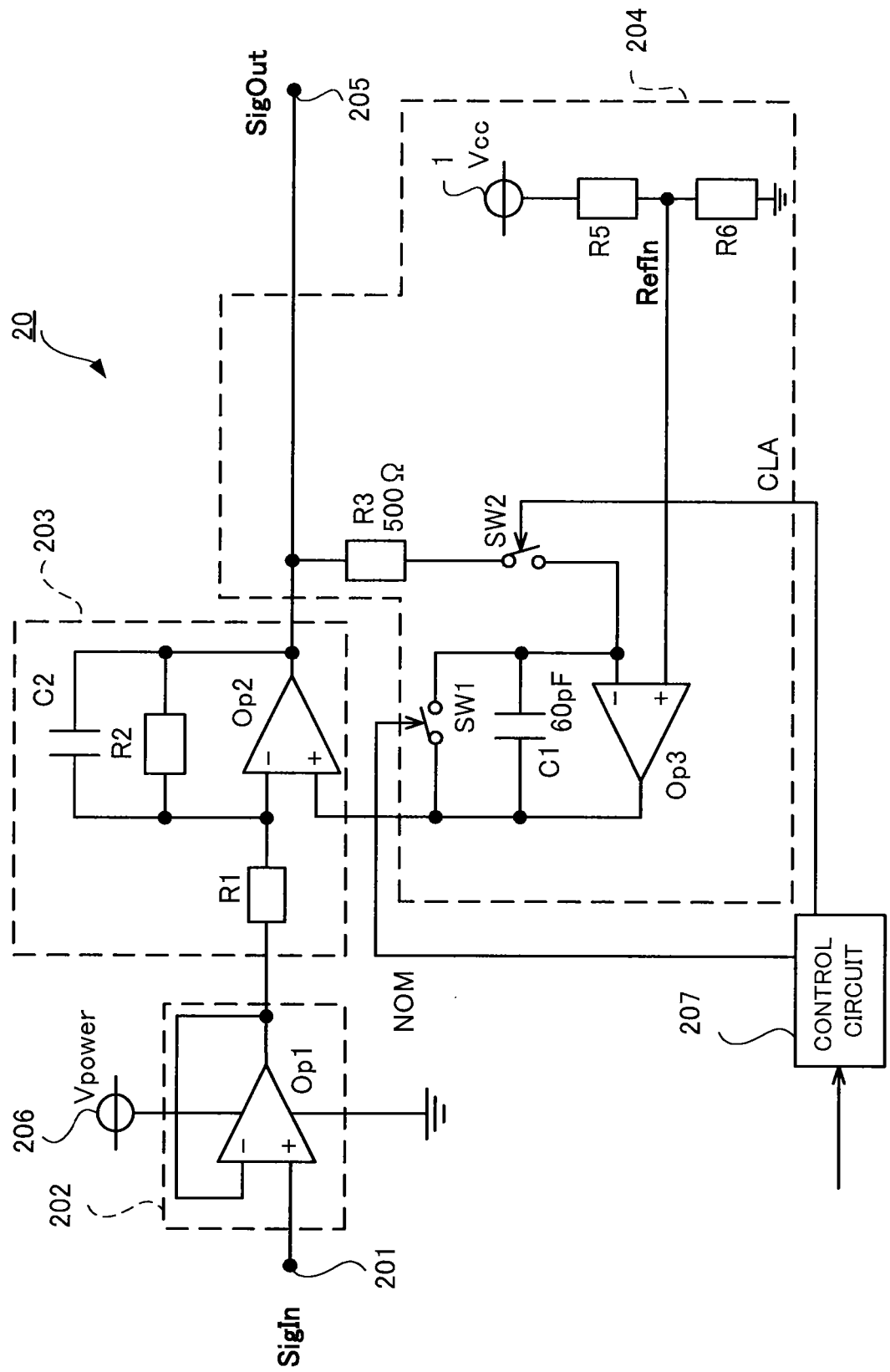
FIG. 2 is a drawing showing a different exemplary composition of an amplifier according to the first preferred embodiment.

FIG. 2 is a drawing showing a different exemplary composition of an amplifier according to the first preferred embodiment. An amplifier 20 shown in FIG. 2 comprises a capacitor C2 (second capacitor) connected in parallel to the resistor R2, in addition to the composition of the amplifier 20 shown in FIG. 1. By providing the capacitor C2, the phase margin of the inverting amplifier 203 is preserved.

Figure 3:
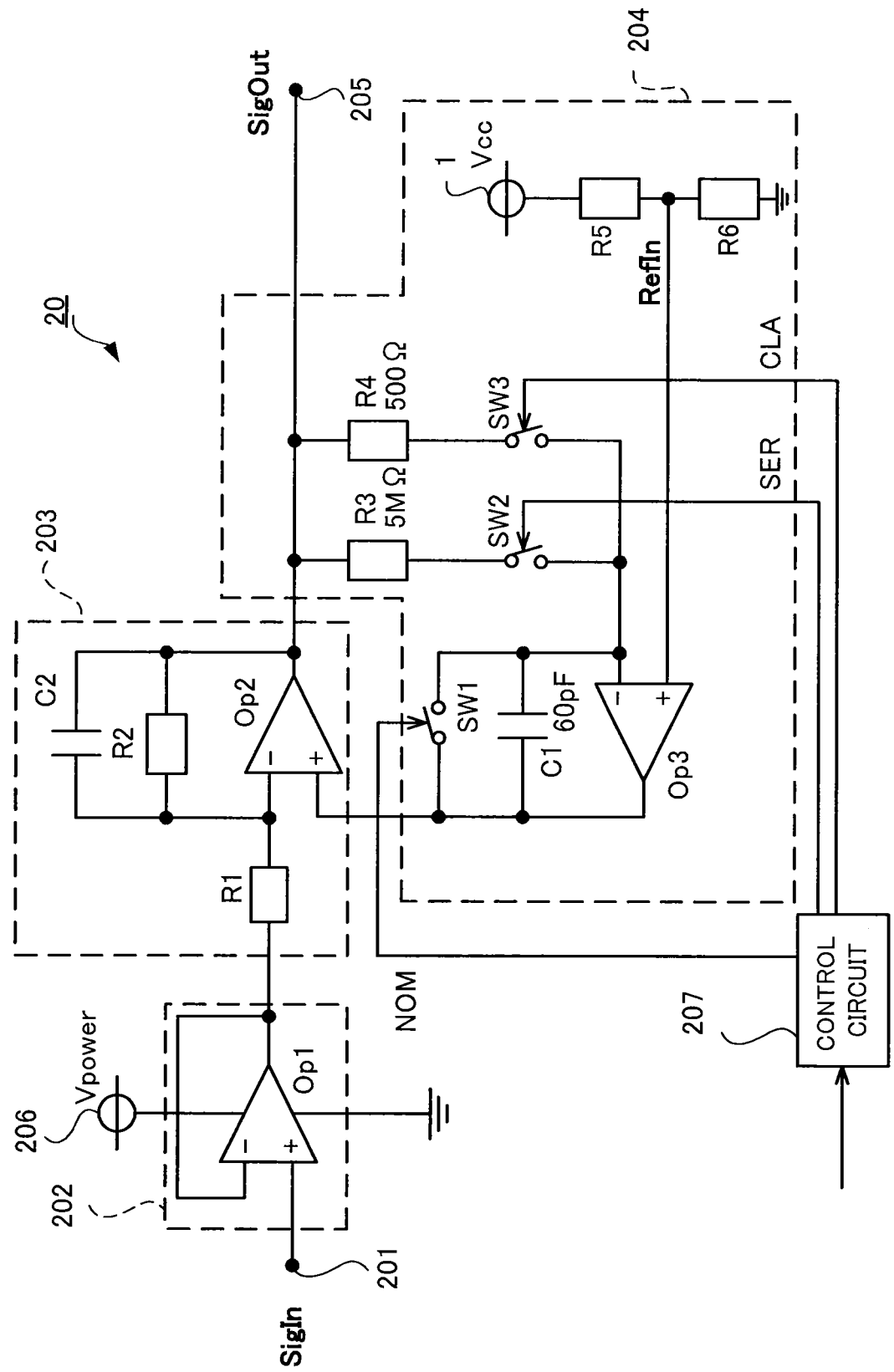
FIG. 3 is a drawing showing a different exemplary composition of an amplifier according to the first preferred embodiment.

FIG. 3 is a drawing showing a different exemplary composition of an amplifier according to the first preferred embodiment. An amplifier 20 shown in FIG. 3 further comprises a resistor R4 (fourth resistor) and a switch SW3 (third switch), in addition to the composition of the amplifier 20 shown in FIG. 3. The resistor R4 and the switch SW3 are connected in series, with one end connected to the output terminal of the op-amp Op2 and the other end connected to the inverting input terminal of the op-amp Op3. The amplifier 20 of FIG. 3 is capable of performing a servo action, and the inverting amplifier 203 and the DC feedback circuit 204 form a DC clam servo amp. When the phase margin fulfills the performance sought even if the capacitor C2 is omitted, it is possible to make the amplifier more compact by omitting the capacitor C2. The same is true in the below-described preferred embodiments.

The control circuit 207 receives input of a NOM signal, a SER signal and a CLA signal, which are amp control signals, and sends the NOM signal to the switch SW1, the SER signal to the switch SW2 and the CLA signal to the switch SW3. The switches SW1, SW2 and SW3 change between on and off based on the signal level of the NOM signal, the SER signal and the CLA signal, respectively.

Figure 4:
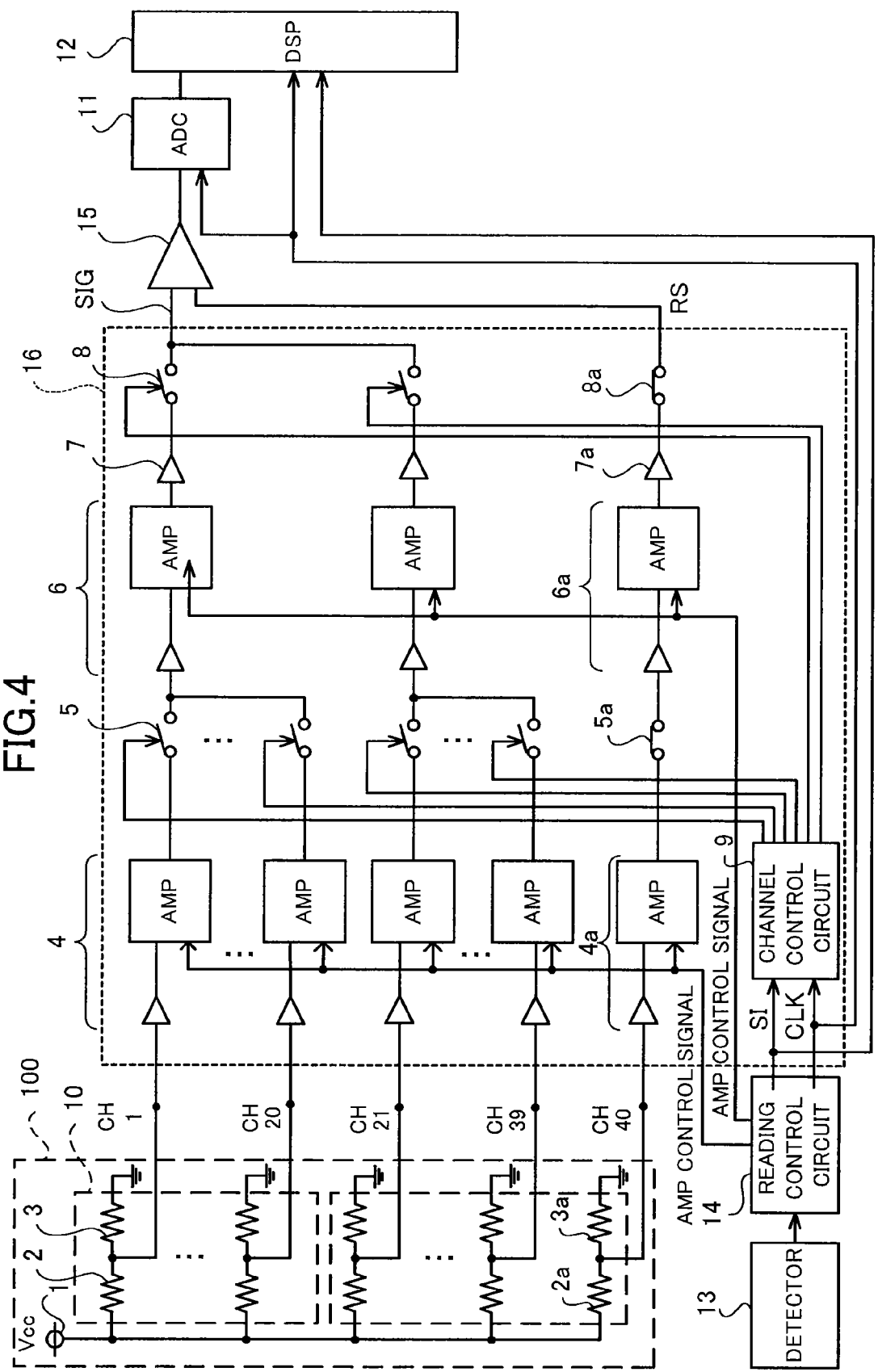
FIG. 4 is a drawing showing an exemplary composition of a signal processing device according to the first preferred embodiment.

FIG. 4 is a drawing showing an exemplary composition of a signal processing device according to the first preferred embodiment. FIG. 4 shows an example of a signal processing device used in a magnetic sensor device. The signal processing device comprises a sensor 100, a detector 13, a reading control circuit 14, an amplifier IC (Integrated Circuit) 16, a differential amplifier 15, an ADC (Analog-to-Digital Converter) 11 and a digital signal processor (hereafter referred to as a "DSP") 12. A detectable body such as paper money is conveyed along an unrepresented conveyance route.

The signal processing device detects the prescribed physical amount that changes due to the detectable body and uses bridge connected MR (MagnetoResistance effect) elements 2 and 3 as detection devices for outputting detection signals whose voltages change in accordance with changes in the prescribed physical amount. The MR element 2 and the MR element 3 are bridge connected and one end of the MR element 2 is connected to a direct current power supply 1 and one end of the MR element 3 is grounded. The midpoint voltage of the MR elements 2 and 3 is output as the detection signal. An MR chip 10 is provided with multiple bridge-connected MR elements 2 and 3. The sensor 100 is provided with multiple MR chips 10 positioned linearly, for example. The MR elements 2 and 3 include at least a portion of the conveyance route in the detection region, and it is possible to detect changes in the prescribed physical amount generated by the detectable body passing along the conveyance route. MR elements 2a and 3a have the same compositions as the MR elements 2 and 3, respectively, but no part of the conveyance route is included in the detection region thereof.

An amplifier IC 16 is provided with channel amplifiers 4 and 4a, channel switches 5 and 5a, output amplifiers 6 and 6a, output buffers 7 and 7a, output switches 8 and 8a and a channel control circuit 9. The channel amplifier 4 for channels CH1 to CH39 is connected to the connection points of the MR elements 2 and 3, respectively, and the channel amplifier 4a for channel CH40 is connected to the connection point of MR elements 2a and 3a. The outputs of the multiple channel amplifiers 4 are input into the output amplifiers 6 via the channel switch 5, respectively, and the output of the channel amplifier 4a is input into the output amplifier 6a via the channel switch 5a. The outputs of the output amplifiers 6 are input into the output buffers 7, respectively, and the output of the output amplifier 6a is input into the output buffer 7a. The output switches 8 are respectively connected to the output buffers 7, and the output switch 8a is connected to the output buffer 7a.

The detector 13 detects entrance of the detectable body into the conveyance route and outputs a detection signal indicating the absence or presence of the entrance of the detectable body into the conveyance route to a reading control circuit 14. The reading control circuit 14 sends an amp control signal whose signal level changes based on the detection signal to the channel amplifiers 4 and the output amplifiers 6. In addition, the reading control circuit 14 sends an SI signal for reading control that is a channel control signal whose signal level changes based on the detection signal to a channel control circuit 9 and the DSP 12, and sends a CLK signal indicating the reading timing that is a channel control signal to the channel control circuit 9, the ADC 11 and the DSP 12.

The channel amplifiers 4 possess the amplifiers 20 shown in any of FIGS. 1 through 3. The amps possessed by the channel amplifiers 4 shown in FIG. 4 mean DC clamp amps or DC clamp servo amps. The channel amplifiers 4 amplify the detection signals by switching the switches possessed by the amplifiers 20 between on and off in a prescribed order based on the amp control signals sent from the reading control circuit 14, and output the amplified signals. Each channel switch 5 is switched between on and off in a prescribed order based on the switch control signals output by the channel control circuit 9 based on the SI signal and CLK signal. By switching each channel switch 5 between on and off in a prescribed order, amplified signals output by each channel amplifier 4 are input into the output amplifier 6 in a prescribed order for example for each 20 channels. For example, the channel switches 5 of CH1 to CH39 are switched from off to on in order, respectively, and are switched to off after a set time has elapsed.

The output amplifiers 6 possess the amplifiers 20 shown in any of FIGS. 1 through 3. The amps possessed by the output amplifiers 6 shown in FIG. 4 mean DC clamp amps or DC clamp servo amps. The output amplifiers 6 switch the switches provided in the amplifiers 20 between on and off in a prescribed order based on the amp control signal output from the reading control circuit 14, and through this amplify the amplified signals and output such to the output buffers 7. Each output switch 8 is switched between on and off in a prescribed order based on the switch control signals the channel control circuit 9 outputs based on the CLK signal. By each output switch 8 between switched between on and off in a prescribed order, the amplified signals amplified by the output amplifiers 6 undergo serial conversion. By the channel switches 5, output amplifiers 6, output buffers 7, output switches 8 and control circuit channel control circuit 9 working together and acting as a parallel-series converter, the amplified signals are converted to series and the SIG signals, being the serial signals, are input into the differential amplifier 15.

The channel amplifier 4a has the same composition as the channel amplifier 4. It is fine for the channel switch 5a to normally be in an on state and to have a composition such that on/off is repeated in synchronous with the on/off of each channel switch 5. The output amplifier 6a has the same composition as the output amplifiers 6. The output buffer 7a has the same composition as the output buffers 7. It is fine for the output switch 8a to normally be in an on state and to have a composition such that on/off is repeated in synchronous with the on/off of each output switch 8. The detection signal that is the midpoint voltage of the MR elements 2a and 3a is amplified by the channel amplifier 4a and the output amplifier 6a, and is input as an RS signal into the differential amplifier 15.

The differential amplifier 15 amplifies the difference between the SIG signal and the RS signal and outputs the result to the ADC 11. The ADC 11 converts the output of the differential amplifier 15 to digital based on the CLK signal and sends the result to the DSP 12. The DSP 12 accomplishes a prescribed signal process based on the SI signal and CLK signal.

Figure 5:
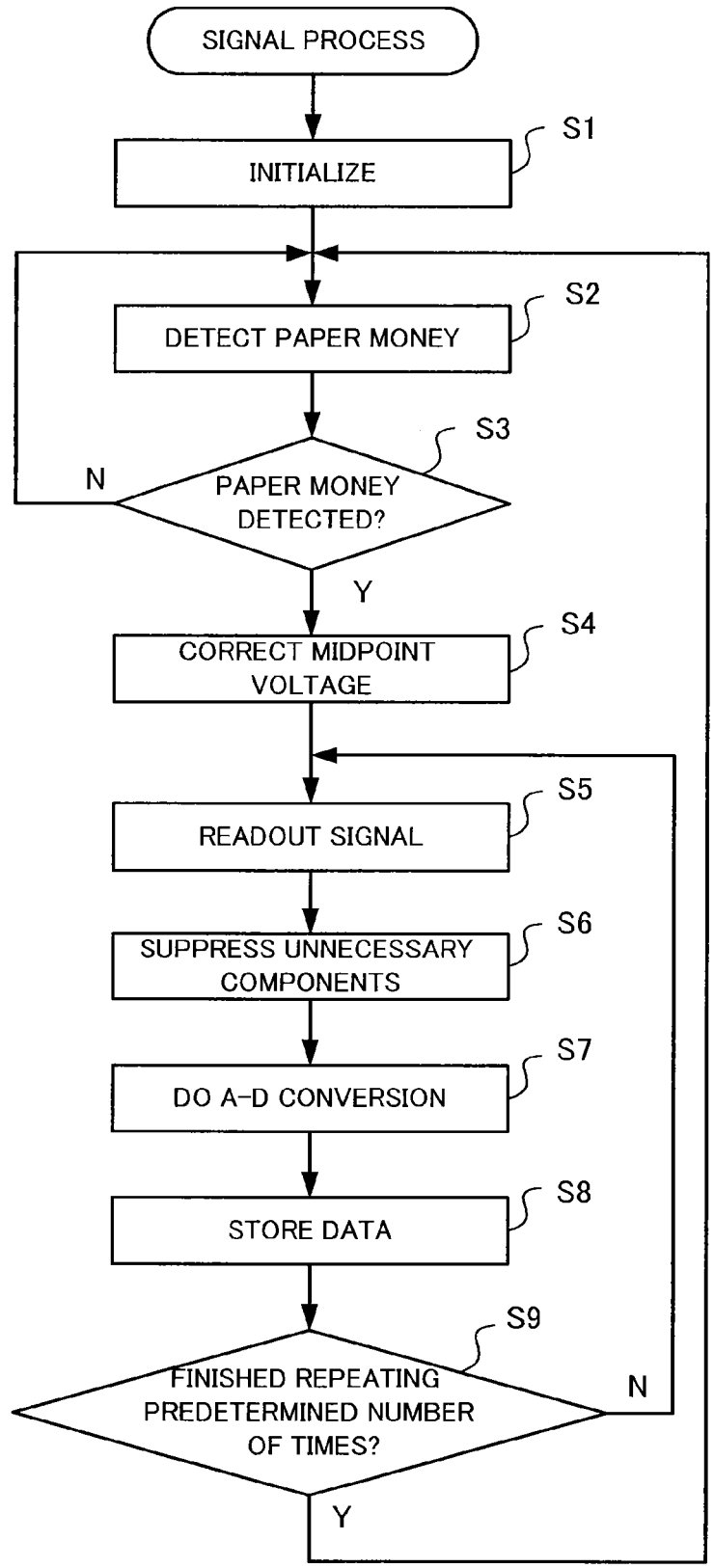
FIG. 5 is a flowchart showing one example of the action of signal processing accomplished by the signal processing device according to the first preferred embodiment.

FIG. 5 is a flowchart showing one example of the actions of a signal process accomplished by the signal processing device according to the first preferred embodiment. FIG. 6 is a state transition drawing for switches according to the first preferred embodiment. FIG. 6 expresses as on or off the state of each switch possessed by the amplifier 20 at each step of the signal process, and expresses as H (High) or L (Low) the level of the amp control signal for controlling the switches. The actions of the signal processing device are explained using FIGS. 5 and 6. Here, the channel amplifiers 4 and 4a and output amplifiers 6 and 6a are considered to possess the amplifiers 20 shown in FIG. 3.

First, an explanation is given for a normal mode in which the DC feedback circuit 204 does not conduct a servo action. The amplifiers 20 possessed by channel amplifiers 4 and 4a and the output amplifiers 6 and 6a accomplish initialization (step S1). In step S1, the switch SW1 of the amplifier 20 respectively possessed by the channel amplifiers 4 and 4a and the output amplifiers 6 and 6a is set to on and the switches SW2 and SW3 are set to off. At this time, the DC feedback circuit 204 has the same composition as the voltage follower amp 206, the reference voltage is impressed on the non-inverting input terminal of the op-amp Op2, and the amplified signal found by multiplying the value found by dividing the resistance value of the resistor R2 by the resistance value of the resistor R1 by the DC position of the signal input into the SigIn terminal 201 is output from the SigOut terminal 205. The reference voltage in step S1 is 2.25 V.

The detector 13 accomplishes detection of whether or not a detectable body has entered the conveyance route (step S2). When there is no entrance of a detectable body into the conveyance route (step S3: N), the detection process of step S2 continues. When entrance of a detectable body into the conveyance route is detected (step S3: Y), the detection signal of the detector 13 becomes the H level and the switch SW3 is switched from off to on. In addition, the reference voltage becomes 1.65 V.

Furthermore, the amplifier 20 possessed by the channel amplifiers 4 and 4a and the output amplifiers 6 and 6a accomplishes a midpoint voltage correction (step S4). In the amplifier 20, when the switches SW1 and SW2 are set to off and the switch SW3 is set to on, feedback is applied so that the voltage of the SigOut terminal 205 matches the reference voltage of 1.65 V, so the voltage of the SigOut terminal 205 stabilizes at the reference voltage of 1.65 V. FIG. 7 is a drawing showing the voltage waveform at the midpoint voltage correction time of the SigOut terminal in the amplifier according to the first preferred embodiment. The top part of FIG. 7 shows the voltage waveform of the SigOut terminal, and the bottom part of FIG. 7 shows the change in the CLA signal. When the CLA signal is at the H level, the switch SW3 is in an on state. For example, supposing the capacitance of the capacitor C1 to be 60 pF and the resistance value of the resistor R4 to be 500Ω, after the switch SW3 switches from off to on, the voltage of the SigOut terminal 205 stabilizes at 1.65 V in the short time of around 20 μsec.

Figure 8:
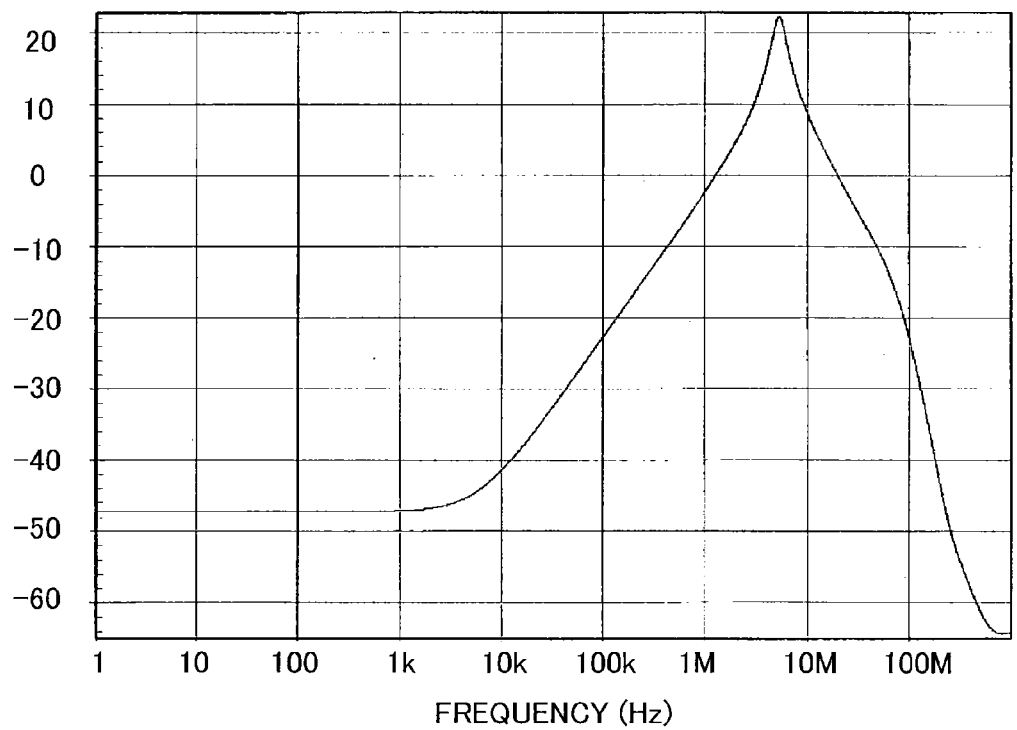
FIG. 8 is a drawing showing the frequency characteristics at the midpoint voltage correction time of the amplifier according to the first preferred embodiment.

FIG. 8 is a drawing showing the frequency characteristics at the midpoint voltage correction time for the amplifier according to the first preferred embodiment. In the above-described example, the lower limit of the cut-off frequency of the amplifier 20 is high at more than 1 MHz, so it is impossible for the low frequency component to pass through the amplifier 20.

Figure 9:
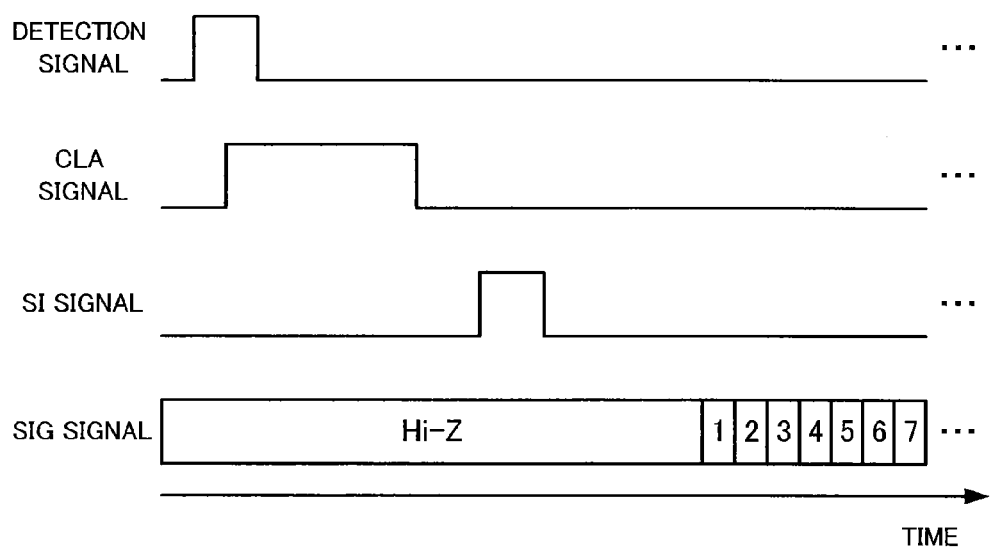
FIG. 9 is a timing chart for various control signals in the first preferred embodiment.

In step S4, when the voltage of the SigOut terminal 205 has stabilized at 1.65 V, the voltage impressed on the capacitor C1 is stored as a bias voltage. Following this, the CLA signal changes to the L level and the switch SW3 switches from on to off. FIG. 9 is a timing chart for each control signal in the first preferred embodiment. After the detection signal changes to the H level, the CLA signal changes to the H level. Furthermore, after a fixed time has elapsed the CLA signal changes to the L level.

The signal processing device accomplishes a reading process (step S5). The reading control circuit 14 accomplishes control so that the SI signal that is the channel control signal changes to the H level. As shown in FIG. 9, the CLA signal changes to the L level after a set time has elapsed, following which the SI signal changes to the H level.

Figure 10:
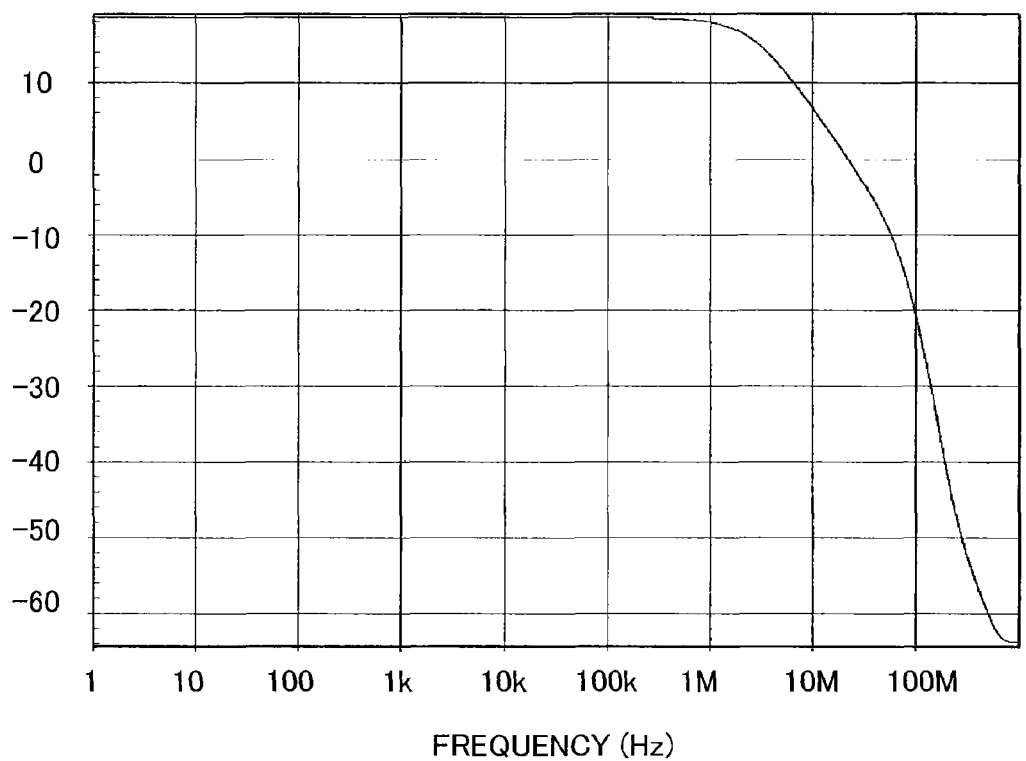
FIG. 10 is a drawing showing frequency characteristics at a signal reading time in a normal mode of the amplifier according to the first preferred embodiment.

In step S5 to S9, the switches SW1, SW2 and SW3 are set to off and the amplifier 20 acts through the bias voltage stored in the capacitor C1. By leaking the electric charge accumulated in the capacitor C1 to a circuit and/or the like, the bias voltage of the capacitor C1 varies. However, when reading a detectable body such as paper money, for example, assuming the conveyance speed is 0.5 msec to 2 msec, it is fine if it is possible for the bias voltage to be stored for around 100 milliseconds. For example, when an op-amp using MOS-FETs (Metal-Oxide-Semiconductor Field-Effect Transistors) is used for the op-amp Op3, if the electrostatic capacitance of the capacitor C1 is several ten pF, it is possible to store the bias voltage for the time needed for reading the detectable body. FIG. 10 is a drawing showing the frequency characteristics during signal reading in normal mode of the amplifier according to the first preferred embodiment. The passing range of the amplifier 20 during signal reading is several Hz to 1 MHz, so it becomes possible to amplify low frequency components.

In step S5, each channel amplifier 4 removes the direct current component of the detection signal that is the midpoint voltage of each MR element 2 and 3 and amplifies the detection signal using the reference voltage as a reference. Each output amplifier 6 removes the direct current component of the amplified signals input in order with the channel switches 5 switching between on and off, and amplifies with the reference voltage as a reference, the same as the channel amplifiers 4. By the output switches 8 switching between on and off in a prescribed order, the amplified signals output by the output amplifiers 6 are input into the differential amplifier 15 in order as SIG signals, as shown in the bottom-most part of FIG. 9. Each number in FIG. 9 indicates the number of a channel.

In addition, the channel amplifier 4a removes the direct current portion of the detection signal that is the midpoint voltage of the MR elements 2a and 3a and amplifies the detection signal with the reference voltage as a reference. The output amplifier 6a removes the direct current component of the amplified signal and amplifies the amplified signal with the reference voltage as the reference, the same as the channel amplifier 4a. The output of the output amplifier 6a becomes the RS signal.

The differential amplifier 15 suppresses unnecessary components (step S6). The detection region of the MR elements 2a and 3a contain no parts of the conveyance route, so the detection signal for CH40 is composed of a direct current component and unnecessary components overlaid by the power source voltage fluctuation, clock interference and/or the like. On the other hand, the detection signals for CH1 to CH39 are composed of a direct current component, an alternating current component and unnecessary components. The MR elements 2a and 3a are formed linearly in the sensor 100 along with the MR elements 2 and 3, so the unnecessary components included in the detection signal of CH40 is a signal virtually in-phase with the unnecessary components included in the detection signals of the other channels.

Figure 11:
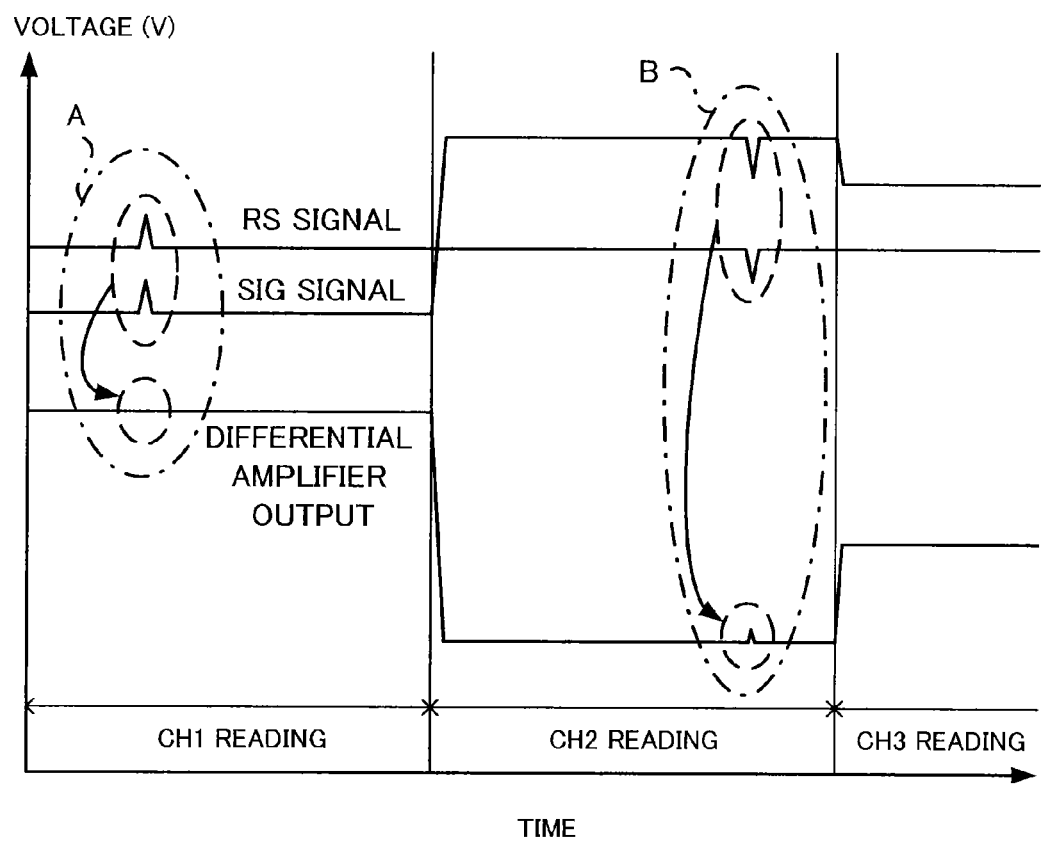
FIG. 11 is a drawing showing the process of unnecessary-wave suppression in a signal processing device according to the first preferred embodiment.

FIG. 11 is a drawing showing the process of unnecessary-wave suppression in the signal processing device according to the first preferred embodiment. The differential amplifier 15 amplifies the difference between the SIG signal and the RS signal. As shown in part A in the CH1 reading time, when unnecessary components that are in-phase and have the same amplitude are overlaid on the SIG signal and RS signal, respectively, a signal in which the unnecessary components have been eliminated is output from the differential amplifier 15. In addition, as shown in the B part in the CH2 reading time, when unnecessary components that are in-phase and have mutually different amplitudes are overlaid on the SIG signal and the RS signal, respectively, a signal in which the unnecessary component is suppressed is output from the differential amplifier 15. That is to say, the in-phase unnecessary components overlaid on the SIG signal and the RS signal are suppressed by the differential amplifier 15 and a signal in which the S/N ratio (Signal-to-Noise ratio) is improved is output from the differential amplifier 15.

The ADC 11 converts to digital the signal output from the differential amplifier 15 (step S7), and sends the result to the DSP 12. The DSP 12 stores the digital signal output by the ADC 11 (step S8). When the reading process has not been repeated a prescribed number of times determined in accordance with the passing time of the detectable body such as paper money (step S9: N), the process returns to step S5 and the reading process is repeated. When the reading process has been repeated the prescribed number of times (step S9: Y), the process returns to step S2 and accomplishes the paper money detection process. The signal processing device repeatedly executes the above-described process.

The DSP 12 signal processes the digital signals stored in step S8 of the above-described signal process, with an arbitrary timing, and outputs the result as magnetic sensor detection data.

When the frequency characteristics of the detected signal are not concentrated in the high range side of several ten kHz or more, the amplifier 20 does not need to accomplish the action in high-speed mode that causes a servo action of the DC feedback circuit 204 described below. Accordingly, it would be fine for the composition of the channel amplifiers 4 and 4a to be such that the amplifier 20 of FIG. 1 or FIG. 2 is provided. In that case, in the amplifier 20 of FIG. 1 or FIG. 2, the switches SW1 and SW2 are switched on and off the same as switches SW1 and SW3 of the amplifier 20 in FIG. 3, as shown in FIG. 5, so it is possible to accomplish the action of signal processing as described above.

Next, the action in high-speed mode that causes a servo action in the DC feedback circuit 204 is explained. When the frequency components contained in the detection signal are more than several ten kHz, it is possible to stabilize the voltage of the SigOut terminal 205 of the amplifier 20 to the reference voltage by causing a servo action at a time constant determined by the electrostatic capacitance of the capacitor C1 and the resistance value of the resistor R3 in the DC feedback circuit 204 of the amplifier 20 possessed by the channel amplifiers 4 and 4a. In order to distinguish from each step starting with step S2 in the normal mode shown in FIG. 5, each step in the high-speed mode shall be labeled as step S2' to S9'. The switch state in step 1 in the case of high-speed mode is the same as in normal mode.

Figure 12:
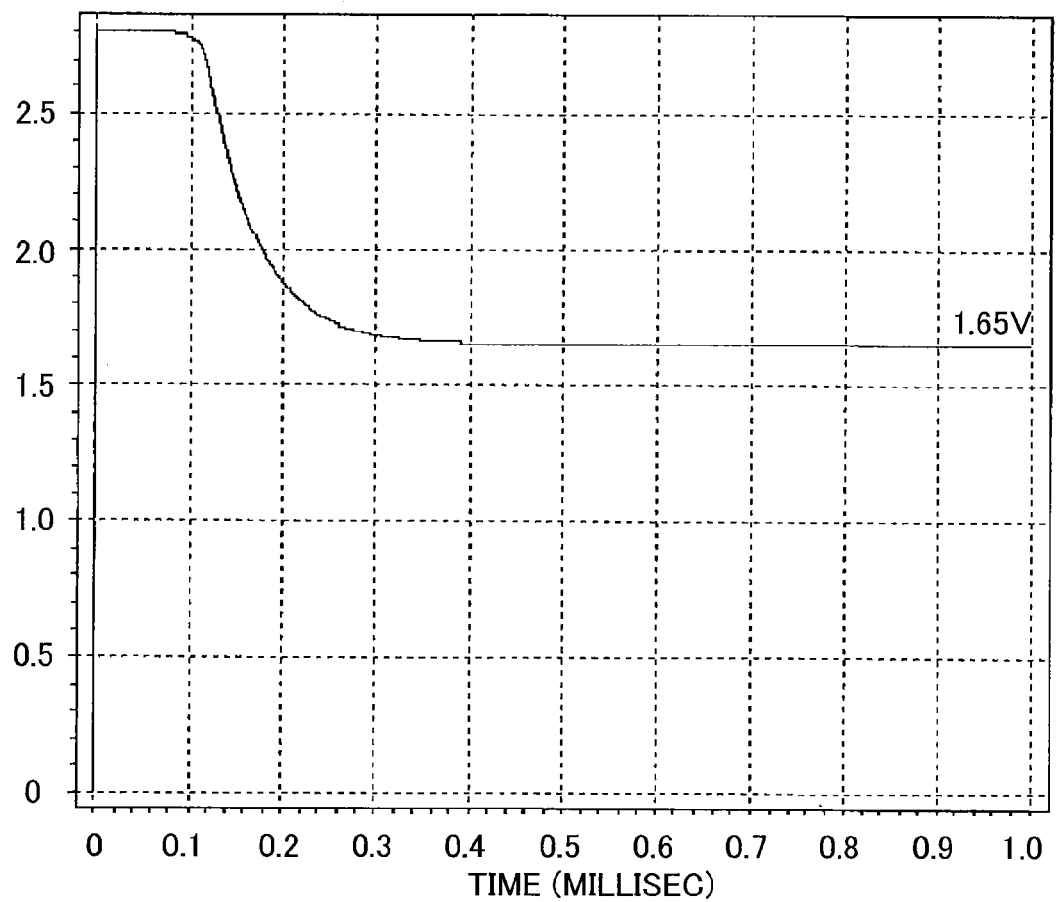
FIG. 12 is a drawing showing a voltage waveform in a high-speed mode of the SigOut terminal of the amplifier according to the first preferred embodiment.

In high-speed mode, after initialization is complete the reading control circuit 14 sets the SER signal to the H level and in steps S2' to S9', the switch SW2 is set to on. FIG. 12 is a drawing showing the voltage waveform of the SigOut terminal of the amplifier in high-speed mode according to the first preferred embodiment. When the switches SW1 and SW3 are set to off, the switch SW2 is set to on and the DC feedback circuit 204 causes a servo action, several hundred microseconds are needed for the voltage of the SigOut terminal 205 to stabilize at 1.65 V. Like in normal mode, in order for the voltage of the SigOut terminal 205 to stabilize in a time of several ten microseconds, when the detector 13 detects a detectable body in step S3', the detection signal of the detector 13 is set to the H level and the switch SW3 needs to be switched from off to on.

Figure 13:
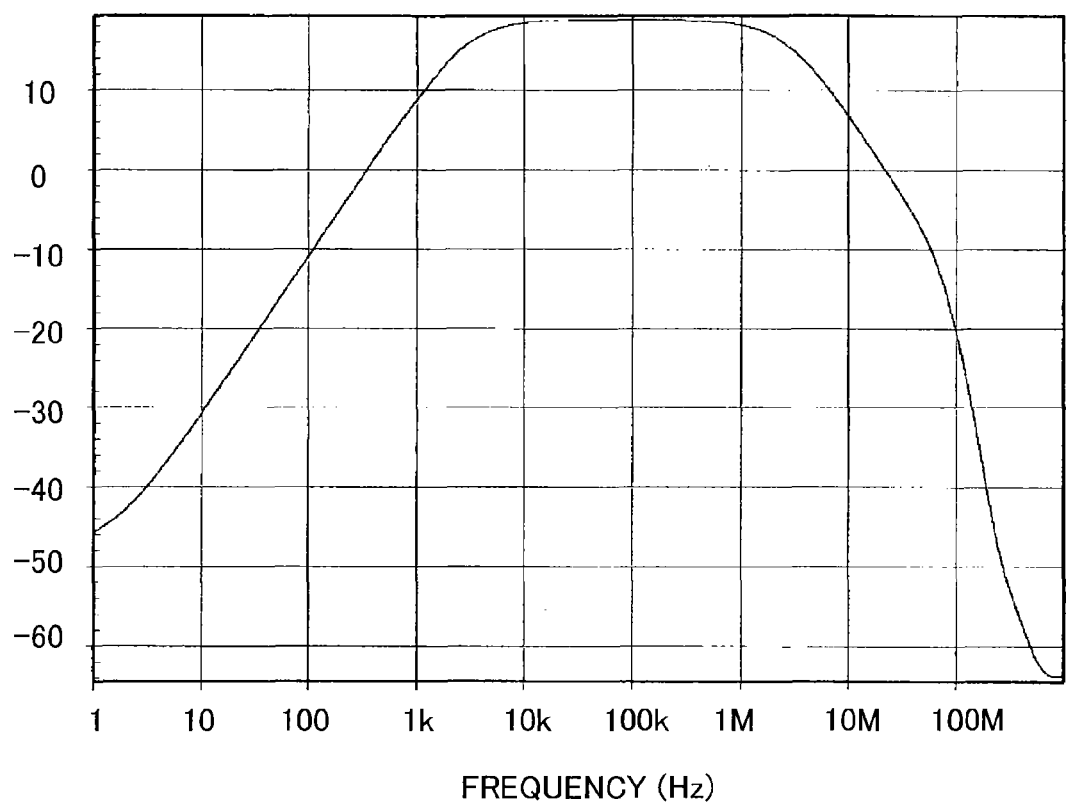
FIG. 13 is a drawing showing frequency characteristics at a signal reading time in the high-speed mode of the amplifier according to the first preferred embodiment.

In high-speed mode, the frequency characteristic in the midpoint voltage correction time of the amplifier 20 is the same as in FIG. 8, and it is impossible for the low-frequency component to pass through the amplifier 20. Following this, the CLA signal changes to the L level and the switch SW3 is switched from on to off. From step S5' on, the switches SW1 and SW3 are off and the switch SW2 is on, so the voltage of the SigOut terminal 205 continues in a state stable at the reference voltage. FIG. 13 is a drawing showing the frequency characteristic at the signal reading time in high-speed mode of the amplifier according to the first preferred embodiment. When the electrostatic capacitance of the capacitor C1 is 60 pF and the resistance value of the resistor R3 is 5 MΩ, the lower limit of the pass-through range of the amplifier 20 is at least several ten kHz, so it is possible to amplify the low-frequency components included in the detection signal.

The channel amplifiers 4 and 4a remove the direct current component of the detection signal the same as in the normal mode, and amplify and output the detection signal with the reference voltage as a reference. The signal processing device accomplishes subsequent processes the same as in the normal mode.

The amplifiers 20 possessed by the output amplifiers 6 and 6a accomplish the same actions in the high-speed mode as in the normal mode, and the DC feedback circuit 204 does not accomplish a servo action. This is in order to avoid unstable actions when reading the amplified signals of each channel in order due to variances in the actions of the channel amplifiers 4 and 4a and the channel switches 5 and 5a. In the amplifiers 20 with which the output amplifiers 6 and 6a are provided, the DC feedback circuit 204 does not accomplish a servo action, so it would be fine for the output amplifiers 6 and 6a to be provided with the amplifier 20 as shown in FIG. 1 or FIG. 2.

Figure 14:
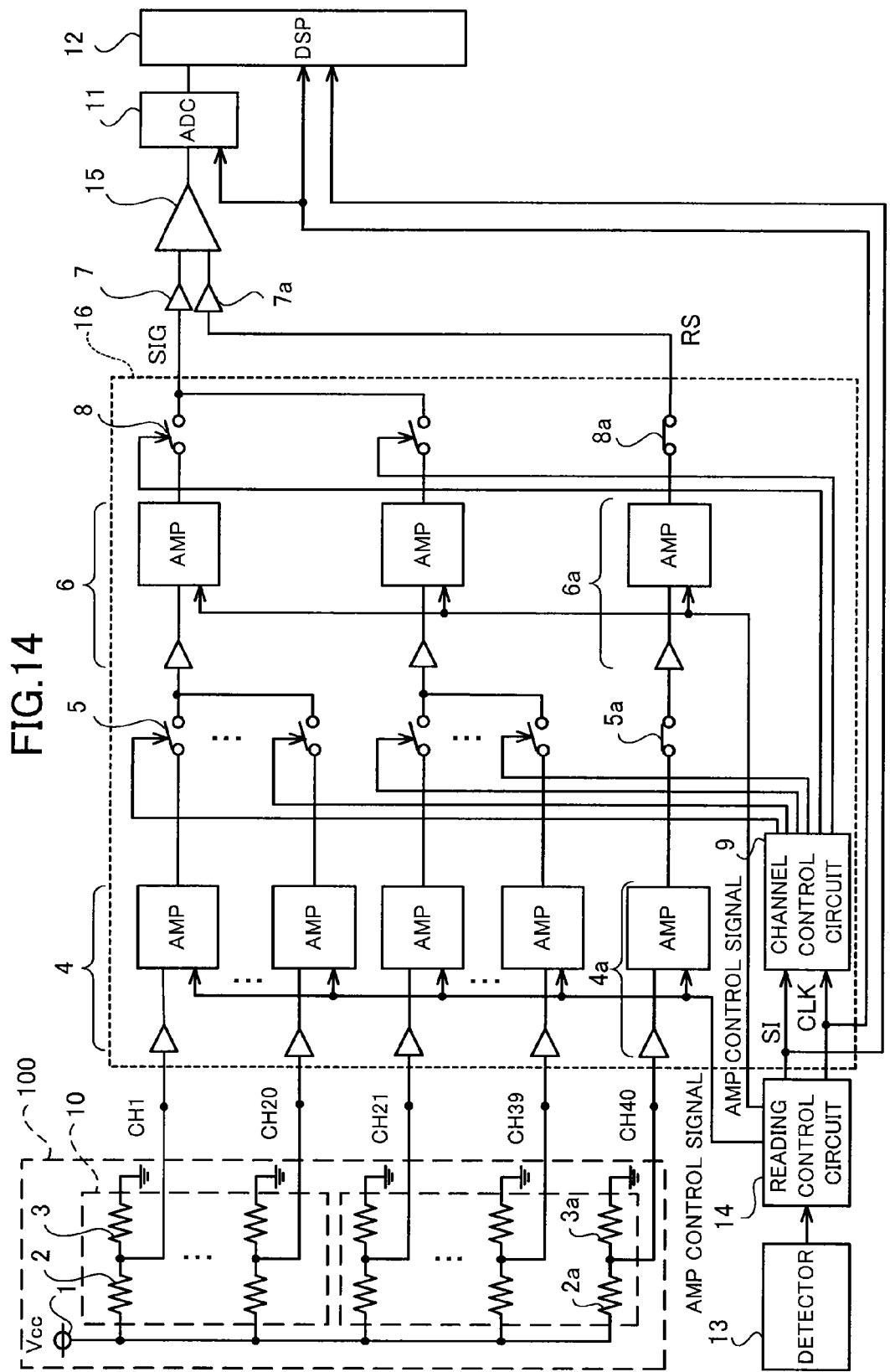
FIG. 14 is a drawing showing a different exemplary composition of the signal processing device according to the first preferred embodiment.

FIG. 14 is a drawing showing a different exemplary composition of the signal processing device according to the first preferred embodiment. In FIG. 4, the output buffers 7 and 7a were provided between the output amplifiers 6 and 6a and the output switches 8 and 8a, but it would be fine to provide the output buffers 7 and 7a between the output switches 8 and 8a and the differential amplifier 15. Because the number of output buffers 7 declines by one, it is possible to make the signal processing device more compact and it is also possible to reduce power consumption by the signal processing device. In addition, it is possible to mitigate the effects of the on resistance of the output switches 8 and 8a on the differential amplifier 15.

As explained above, with this first preferred embodiment, by the switches with which the amplifier 20 is provided being switched on and off in a prescribed order, it is possible to remove the direct current component of the detection signal and amplify the detection signal with the reference voltage as the reference. In the normal mode, it is possible to obtain an output in which the low-frequency components are also amplified, and in the high-speed mode it is possible to amplify the detection signal in a more stable state. In addition, by removing the direct-current component of the detection signal, variances in the midpoint voltage of each MR element 2 and 3 are corrected, so when the MR elements 2 and 3 are arranged linearly, it is possible to obtain a stable output from the signal processing device.

In this first preferred embodiment, the electrostatic capacitance of the capacitors C1 and C3 contained in the amplifier 20 is small at several ten pF and the mounting surface area is small, so it is possible to obtain a compact amplifier 20 and signal processing device. In addition, because the electrostatic capacitance is small, it is possible to make this a constituent element of an IC, and by making an IC chip of each op-amp along with each resistor, it is possible to make the amplifier 20 and the signal processing device more compact.

With this first preferred embodiment, an example was explained for the case in which MR elements 2, 2a, 3 and 3a are used as detection elements. It is possible for the composition of the first preferred embodiment to also be applied to a signal processing device using detection elements having multiple light-receiving elements as in an image sensor device, for example.

Second Preferred Embodiment

FIG. 15 is a drawing showing the variance in midpoint voltage in a differential amplifier provided in a signal processing device according to a second preferred embodiment of the present invention. This shows the variance in the midpoint voltages of outputs of the differential amplifier 15 at the time of signal reading when the total gain, which is the gain for the signal processing device as a whole, is a constant and the gain of the channel amplifiers 4 and 4a, the output amplifiers 6 and 6a and differential amplifier 15 is caused to change, in the signal processing device shown in FIG. 4 or FIG. 14.

In the amplifier 20 according to the first preferred embodiment, at the time of midpoint voltage correction, through the action of the op-amp Op3 the output voltage of the op-amp Op3 is set so that the voltage of the SigOut terminal 205 that is input into the inverting input terminal of the op-amp Op3 is the same as the reference voltage input into the non-inverting input terminal of the Op3. The DC offset of the op-amps Op1 and Op2 is mitigated, but because of not being corrected the DC offset of the op-amp Op3, the voltage of the SigOut terminal 205 fluctuates from the reference voltage by the amount of the DC offset of the op-amp Op3. Fluctuations in the output of the channel amplifiers 4 and 4a are amplified by the output amplifiers 6 and 6a and the differential amplifier 15. The amplified fluctuations are not corrected in the processes after the midpoint voltage correction.

When the intent is to realize a given total gain, as shown in pattern 3, when the gain of the channel amplifiers 4 and 4a is made larger than each of the gains of the output amplifiers 6 and 6a and the differential amplifier 15, it is possible to control the above-described amplification of fluctuations, making it possible to suppress variances in the midpoint voltage of the output of the differential amplifier 15.

As shown in the pattern 3, when the gain of the output amplifiers 6 and 6a is made larger than the gain of the differential amplifier 15, it is possible to control amplification of fluctuations in the output caused by the DC offset of the channel amplifiers 4 and 4a and the output amplifiers 6 and 6a, so it becomes possible to suppress variances in the midpoint voltage of the output of the differential amplifier 15.

As explained above, with this second preferred embodiment, the gain of the channel amplifiers 4 and 4a is made larger than each of the gains of the output amplifiers 6 and 6a and the differential amplifier 15, and through this is become possible to mitigate fluctuations in the output of the signal processing device.

Third Preferred Embodiment

Figure 16:
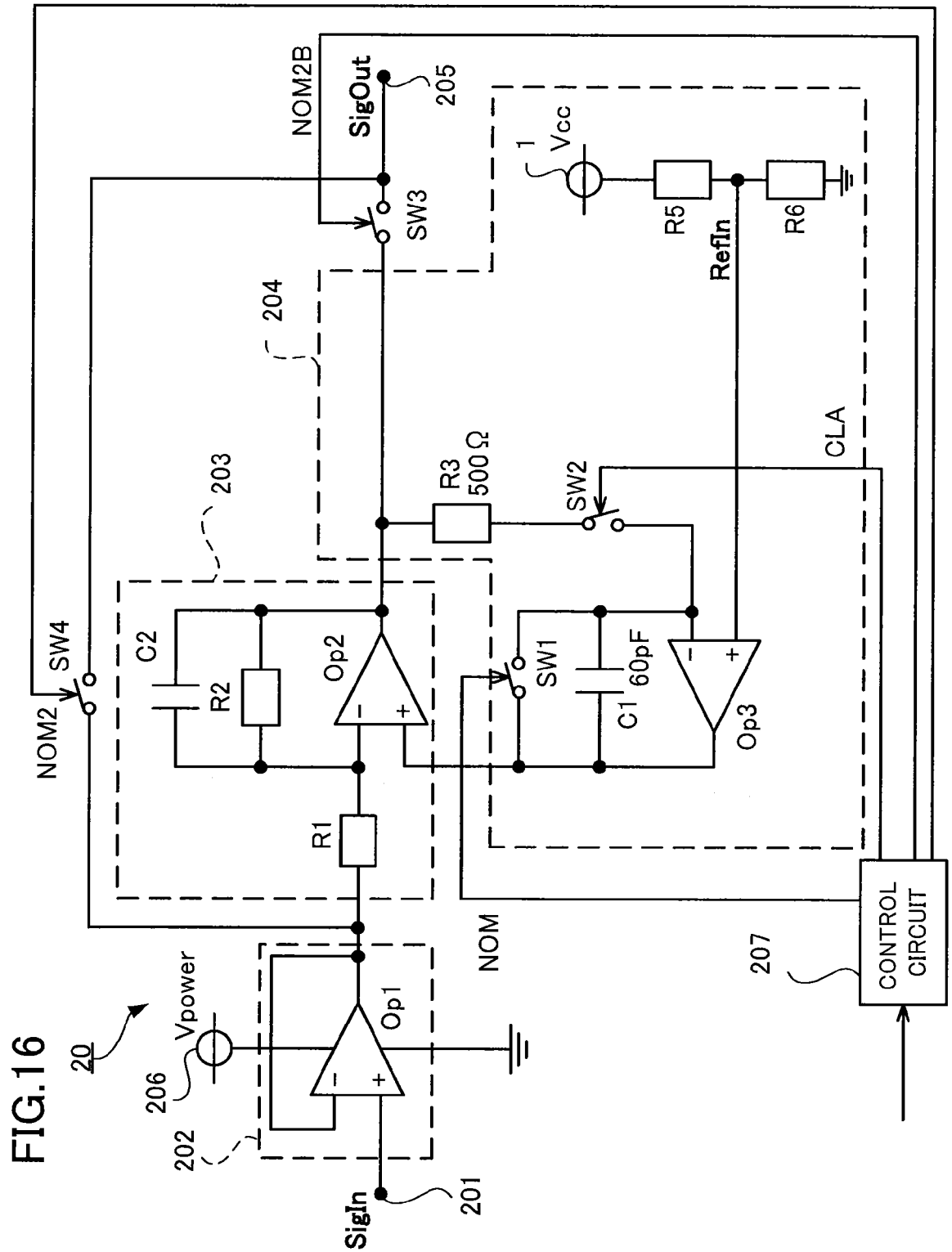
FIG. 16 is a drawing showing an exemplary composition of an amplifier according to a third preferred embodiment of the present invention.

FIG. 16 is a drawing showing an exemplary composition of an amplifier according to a third preferred embodiment of the present invention. The composition of the signal processing device according to the third preferred embodiments is the same as that of the first preferred embodiment, with the channel amplifiers 4 and 4a provided with an amplifier 20 shown in FIG. 16 and the output amplifiers 6 and 6a provided with the amplifier 20 shown in FIG. 1 or FIG. 2. The amplifier 20 shown in FIG. 16 has the composition of the amplifier 20 shown in FIG. 2 and further comprises a switch SW3 and a switch SW4 (fourth switch). The switch SW3 switches the connection between the output terminal of the op-amp Op2 and the SigOut terminal 205 between on and off. One end of the switch SW4 is connected between the output terminal of the voltage follower amp 202 and the resistor R1, and the other end is connected between the switch SW3 and the SigOut terminal 205.

A control circuit 207 receives input of a NOM signal, a CLA signal, a NOM2B signal and a NOM 2 signal, which are amp control signals, and sends the NOM signal to the switch SW1, the CLA signal to the switch SW2, the NOM2B signal to the switch SW3 and the NOM2 signal to the switch SW4. The switches SW1, SW2, SW3 and SW4 are switched on and off based on the signal levels of the NOM signal, the CLA signal, the NOM2B signal and the NOM2 signal, respectively.

FIG. 17 is a state transition drawing for switches in the third preferred embodiment. At initialization, it is fine for the total gain of the signal processing device to be several ten times. At initialization, by setting the switch SW4 to on and the switches SW2 and SW3 to off, it is possible to lower the gain of the channel amplifiers 4 and 4a and to prevent saturation of the circuit, as shown in FIG. 17. In addition, because the op-amps Op2 and Op3 are unnecessary at the time of initialization, by not supplying bias current to the op-amps Op2 and Op3 it is possible to reduce power consumption. At the time of initialization, it would be fine for the switch SW1 to be on, or off.

As explained above, with this third preferred embodiment, when the gain of the channel amplifiers 4 and 4a is larger than each of the gains of the output amplifiers 6 and 6a and the differential amplifier 15, it is possible to prevent the circuit from becoming saturated at the time of initialization and to reduce power consumption by the signal processing device.

Fourth Preferred Embodiment

Figure 18:
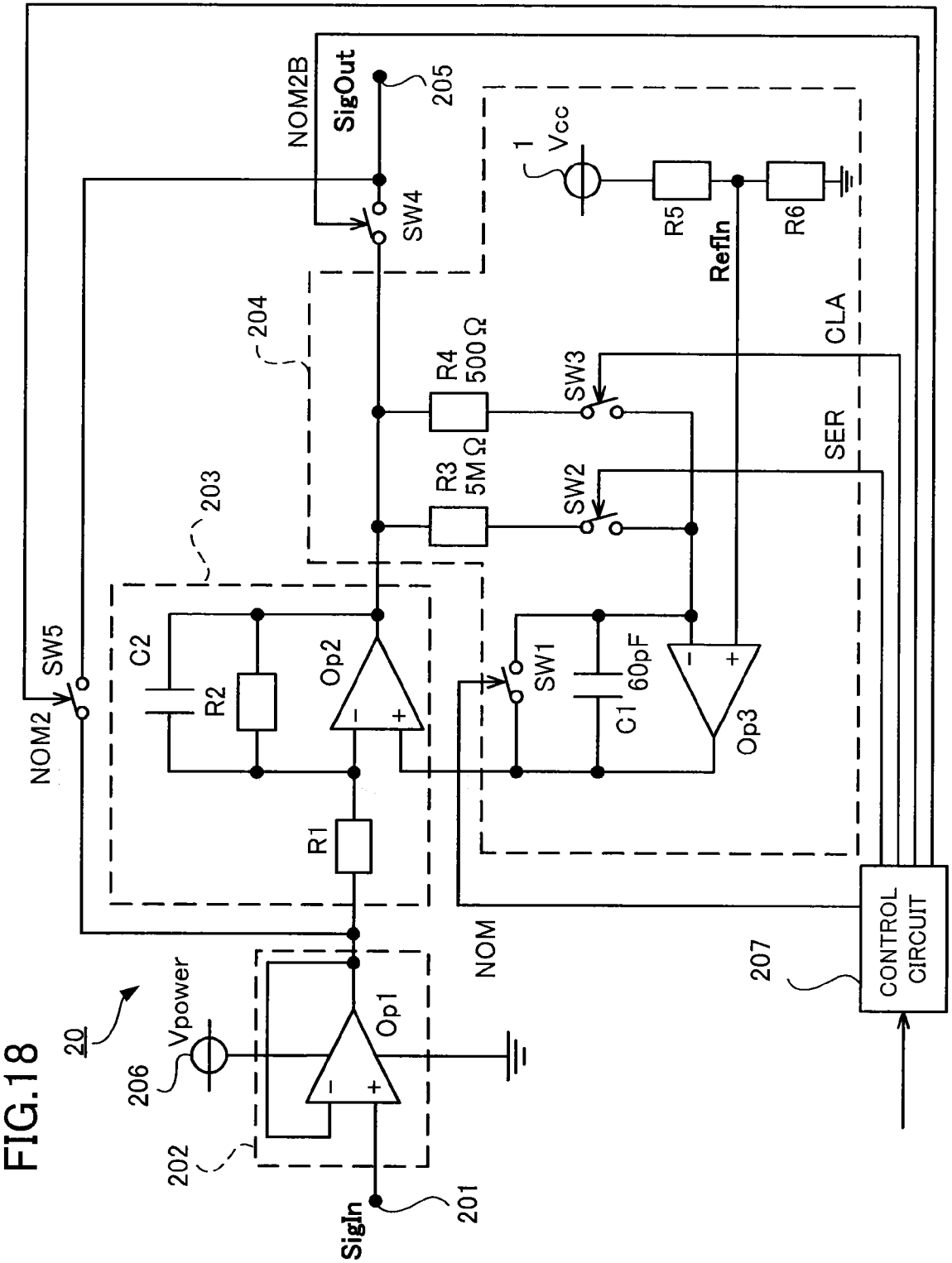
FIG. 18 is a drawing showing an exemplary composition of an amplifier according to a fourth preferred embodiment of the present invention.

FIG. 18 is a drawing shown an exemplary composition of an amplifier according to a fourth preferred embodiment of the present invention. The composition of the signal processing device according to the fourth preferred embodiment is the same as that of the first preferred embodiment, and the channel amplifiers 4 and 4a are provided with the amplifier 20 shown in FIG. 18 and the output amplifiers 6 and 6a are provided with the amplifier 20 shown in FIG. 3. The amplifier 20 shown in FIG. 18 has the composition of the amplifier 20 shown in FIG. 3 and further comprises a switch SW4 and a switch SW5 (fifth switch). The switch SW4 switches the connection between the output terminal of the op-amp Opt and the SigOut terminal 205 between on and off. One end of the switch SW5 is connected between the output terminal of the voltage follower amp 202 and the resistor R1, and the other end is connected between the switch SW4 and the SigOut terminal 205.

A control circuit 207 receives input of a NOM signal, a SER signal, a CLA signal, a NOM2B signal and a NOM2 signal, which are amp control signals, and sends the NOM signal to the switch SW1, the SER signal to the switch SW2, the CLA signal to the switch SW3, the NOM2B signal to the switch SW4 and the NOM2 signal to the switch SW5. The switches SW1, SW2, SW3, SW4 and SW5 are switched on and off based on the signal levels of the NOM signal, the SER signal, the CLA signal, the NOM2B signal and the NOM2 signal, respectively.

FIG. 19 is a state transition drawing of switches in the fourth preferred embodiment. At initialization, it is fine for the total gain of the signal processing device to be several ten times. At initialization, by setting the switch SW5 to on and the switches SW2, SW3 and SW4 to off, it is possible to lower the gain of the channel amplifiers 4 and 4a and to prevent saturation of the circuit, as shown in FIG. 19. In addition, because the op-amps Op2 and Op3 are unnecessary at the time of initialization, by not supplying bias current to the op-amps Op2 and Op3 it is possible to reduce power consumption. At the time of initialization, it would be fine for the switch SW1 to be on, or off.

As explained above, with this fourth preferred embodiment, when the gain of the channel amplifiers 4 and 4a is larger than each of the gains of the output amplifiers 6 and 6a and the differential amplifier 15, it is possible to prevent the circuit from becoming saturated at the time of initialization and to reduce power consumption by the signal processing device.

Fifth Preferred Embodiment

Figure 20:
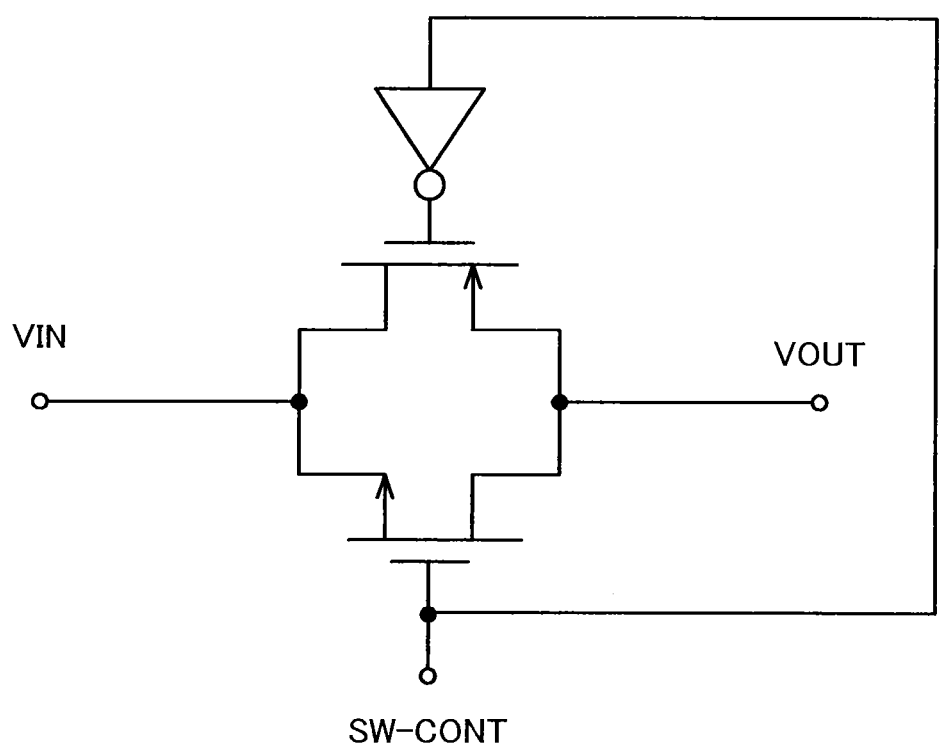
FIG. 20 is a circuit drawing for complementary switches provided in an amplifier according to a fifth preferred embodiment of the present invention.

FIG. 20 is a circuit diagram for complementary switches provided in an amplifier according to a fifth preferred embodiment of the present invention. In this fifth preferred embodiment, the complementary switch shown in FIG. 20 is used as the switch provided in the amplifier according to the first through fourth preferred embodiments as a switch that is switched on and off by the CLA signal. The complementary switch is a circuit combining an N-type MOSFET and a P-type MOSFET. The CLA signal is input into the SW-CONT terminal, and is switched on and off between VIN-VOUT.

By using the complementary switch shown in FIG. 20, fluctuations in the electric charge accumulated in the capacitor C1 originating from switching during midpoint voltage correction is suppressed and it becomes possible to control fluctuations in the voltage of the SigOut terminal 205. Furthermore, it is possible to reduce variance in the midpoint voltage of the output of the differential amplifier 15.

As explained above, with this fifth preferred embodiment, by using a complementary switch as a switch that is switched on and off by the CLA signal, it is possible to reduce fluctuations in the output of the signal processing device.

Sixth Preferred Embodiment

Figure 21:
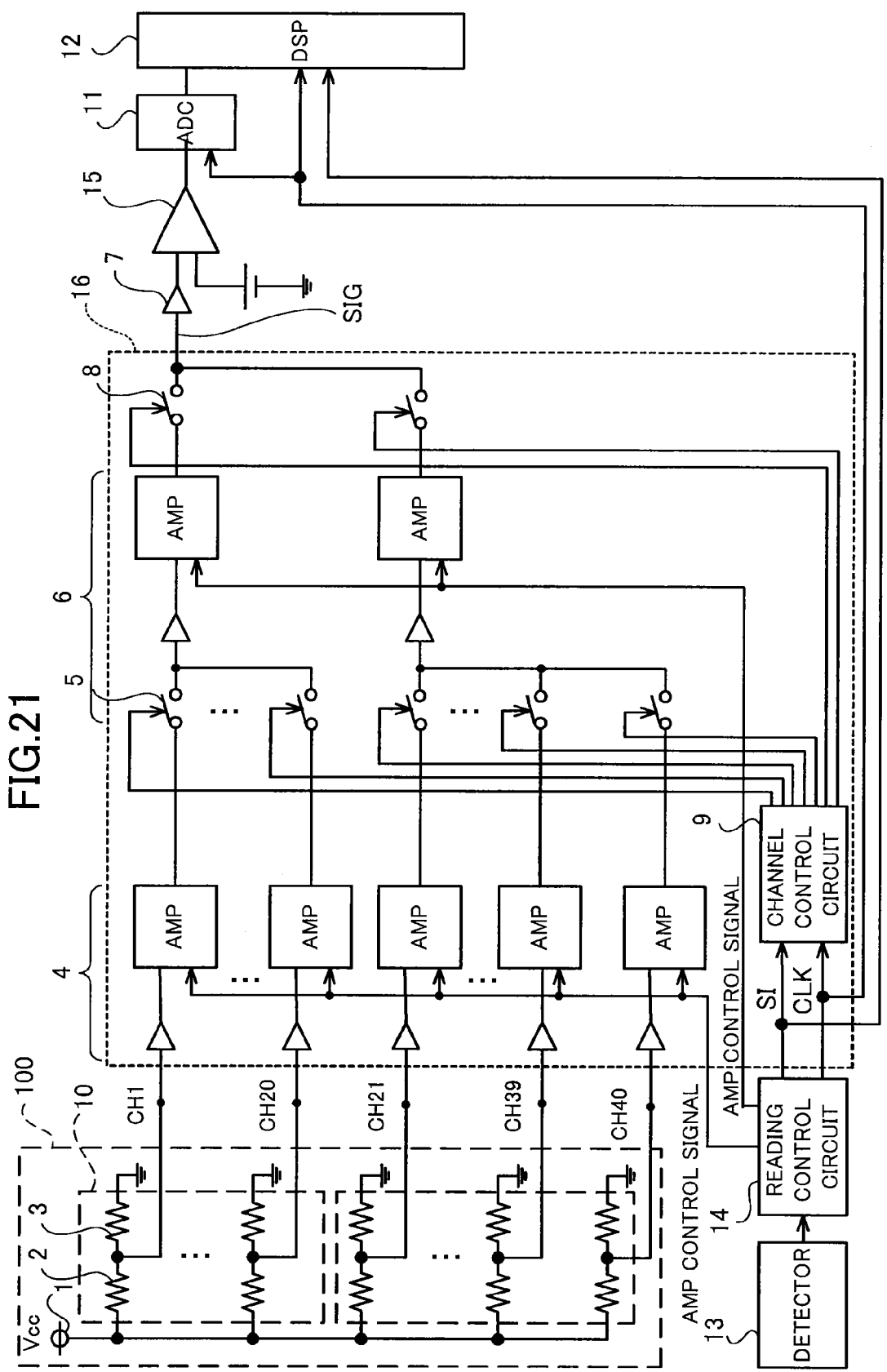
FIG. 21 is a drawing showing an exemplary composition of a signal processing device according to a sixth preferred embodiment of the present invention.

FIG. 21 is a drawing showing an exemplary composition of a signal processing device according to a sixth preferred embodiment of the present invention. Unlike the signal processing device according to the first preferred embodiment shown in FIG. 4 or FIG. 14, each of the MR elements 2 and 3 of CH1 through CH40 includes at least a portion of the conveyance route in the detection region, and the detection signal of CH40 is also input into the output amplifier 6 via the channel amplifiers 4 and the channel switches 5. Furthermore, the detection signals of CH1 through CH40 are included in the SIG signal. The differential amplifier 15 amplifies the difference between the SIG signal and a prescribed voltage and sends the result to the ADC 11. When unnecessary components contained in the detection signal are small or when improvement of the SN ratio of the output signal of the signal processing device is unnecessary, it is possible to use a signal processing device like the one shown in FIG. 21.

As explained above, with this sixth preferred embodiment, the detection signals of all channels of the MR chip 10 are contained in the SIG signal, so it is possible to improve the resolution of the detectable body and expand the reading range.

Seventh Preferred Embodiment

Figure 22:
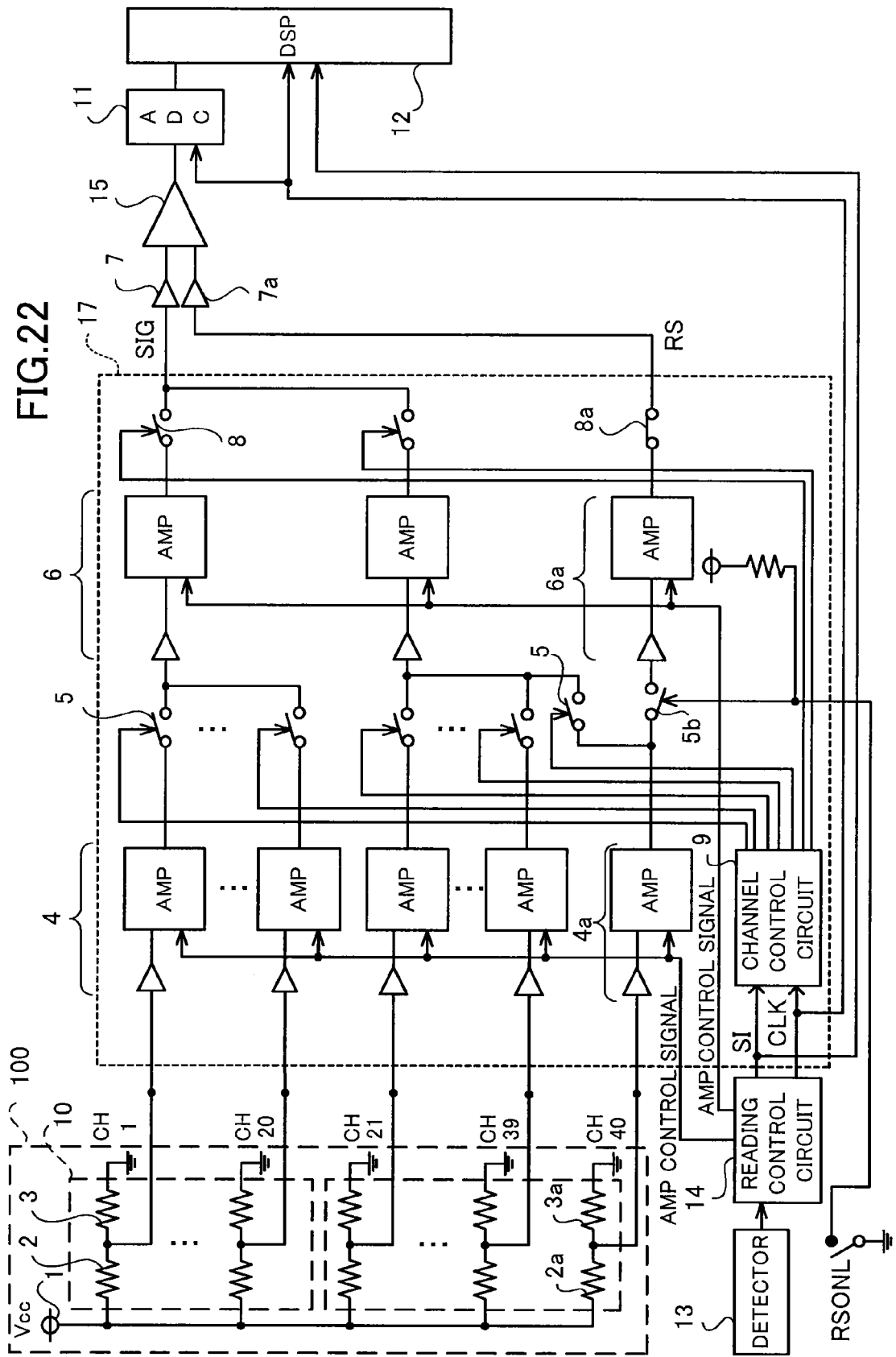
FIG. 22 is a drawing showing an exemplary composition of a signal processing device according to a seventh preferred embodiment of the present invention.

FIG. 22 is a drawing shown an exemplary composition of a signal processing device according to a seventh preferred embodiment of the present invention. The amplifier IC 17 possessed by the signal processing device according to the seventh preferred embodiment is provided with a channel switch 5 disposed between the channel amplifier 4a and the output amplifier 6, and a channel switch 5b disposed between the channel amplifier 4a and the output amplifier 6a. The channel switch 5 connected to the channel amplifier 4a is switched on and off by a switch control signal output by the channel control circuit 9. The channel switch 5b is switched on and off by a RSONL signal indicating whether or not the channel amplifier 4a is connected to the MR elements 2a and 3a that do not include any part of the conveyance route in the detection region.

As shown in FIG. 22, when the channel amplifier 4a is connected to the MR elements 2a and 3a that do not include any part of the conveyance route in the detection region the channel switch 5b is set to on. When the channel amplifier 4a is connected to the MR elements 2 and 3 containing at least a portion of the conveyance route in the detection region, the channel switch 5b is set to off. In this drawing, only the channel amplifier 4a of CH40 is connected to the channel switch 5 and the channel switch 5b, but it would be fine to have the same composition for CH20. In this case, it is possible to comprise the sensor 100 using only one type of MR chip 10.

By connecting the terminal of the RSONL signal to a direct current power source with a pull-up resister, and making the channel switch 5b on when the RSONL signal is at the L level and making the channel switch 5b off when the RSONL signal is at the H level, it can be done just by grounding the terminal of the RSONL signal when the channel amplifier 4a is connected to the MR elements 2a and 3a. This makes planning easier. With the above-described composition, when the MR elements 2a and 3a not containing any portion of the conveyance route in the detection region exist, the differential amplifier 15 amplifies and outputs the difference between the SIG signal and the RS signal or a prescribed voltage, and when detection elements containing no part of the conveyance route in the detection region do not exist, amplifies and outputs the difference between the SIG signal and a prescribed voltage.

As explained above, with this seventh preferred embodiment, it is possible to comprise the sensor 100 using one type of MR chip 10, and in addition planning of the amplifier IC 17 becomes easy.

Eighth Preferred Embodiment

Figure 23:
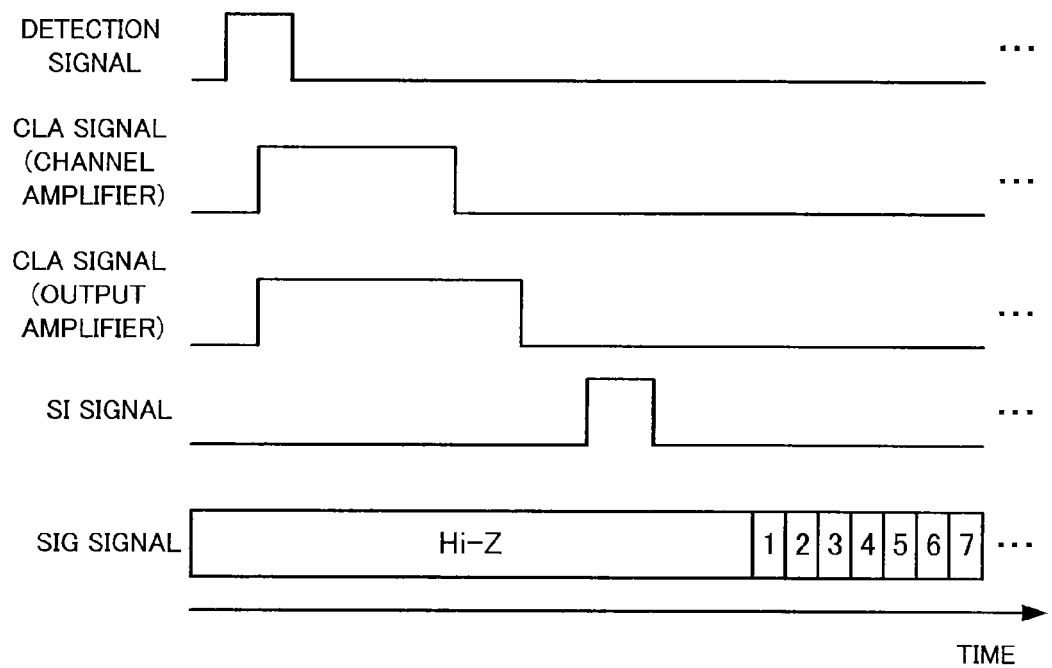
FIG. 23 is a timing chart for various control signals according to an eighth preferred embodiment of the present invention.

FIG. 23 is a timing chart for the control signals in an eighth preferred embodiment of the present invention. The signal processing device according to the eighth preferred embodiment is the signal processing device according to the first preferred embodiment shown in FIG. 4 or FIG. 14 with the CLA signals controlling the channel amplifiers 4 and 4a and the output amplifiers 6 and 6a respectively made independent. As shown in FIG. 23, after the CLA signal for controlling the channel amplifiers 4 and 4a is set to off, the CLA signal for controlling the output amplifiers 6 and 6a is set to off, and with this composition it is possible to stabilize the actions of the signal processing device.

Figure 24:
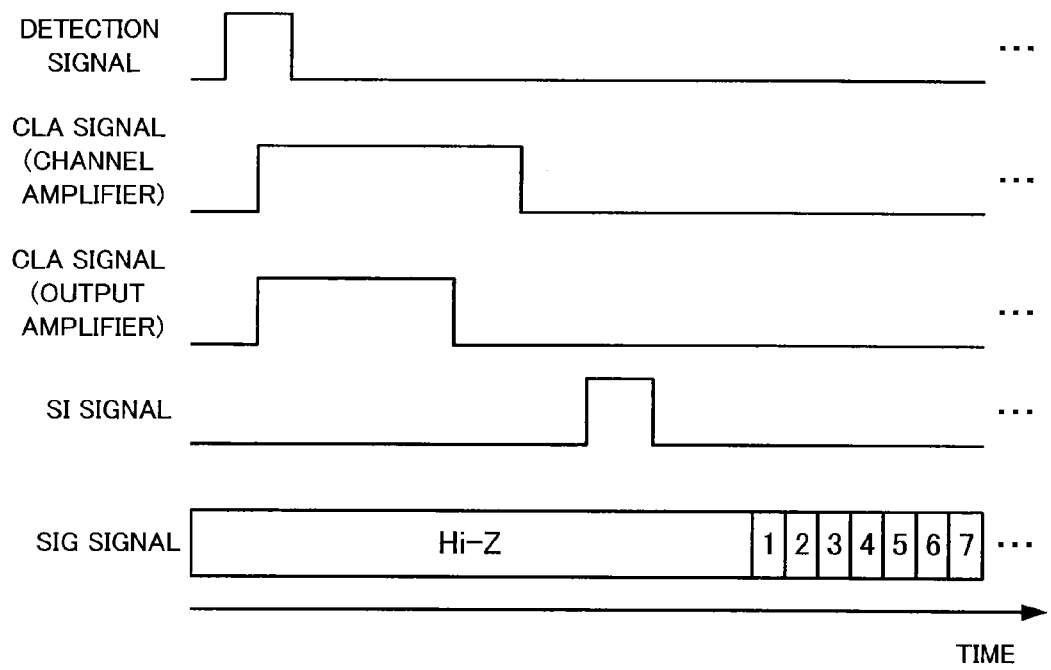
FIG. 24 is a different timing chart for various control signals according to the eighth preferred embodiment of the present invention.

FIG. 24 is a different timing chart for the control signals in the eighth preferred embodiment. As shown in FIG. 24, after the CLA signal for controlling the output amplifiers 6 and 6a is set to off, the CLA signal for controlling the channel amplifiers 4 and 4a is set to off, and with this composition it is possible to stabilize the actions of the signal processing device.

As explained above, with this eighth preferred embodiment, because the CLA signal for controlling the channel amplifiers 4 and 4a and the CLA signal for controlling the output amplifiers 6 and 6a are set to off with different timing, it is possible to stabilize the actions of the signal processing circuit.

Ninth Preferred Embodiment

FIG. 25 is a state transition drawing for switches in a ninth preferred embodiment of the present invention. In the signal processing device according to this ninth preferred embodiment, the CLA signals controlling the channel amplifiers 4 and 4a and the output amplifiers 6 and 6a are respectively independent, and the CLA signal for controlling the output amplifiers 6 and 6a is constantly set to off.

When the variance in the midpoint voltage of the MR elements 2 and 3 is in a prescribed range in which the variance is deemed not great, as shown in FIG. 25 it is fine to have a composition such that the switch SW1 of the amplifier 20 shown in FIG. 3 provided in the output amplifiers 6 and 6a is constantly on and the switches SW2 and SW3 are constantly set to off. That is to say, by omitting the switches SW1, SW2 and SW3 and the resistors R3 and R4, it becomes possible to make the amplifier 20 more compact. Similarly, when the output amplifiers 6 and 6a are provided with the amplifier 20 shown in FIG. 1 or FIG. 2, by omitting the capacitor C1, the switches SW1 and SW2 and the resistor R3, it becomes possible to make the amplifier 20 more compact.

FIG. 26 is a state transition drawing for switches according to the ninth preferred embodiment. Similar to the amplifier 20 with which the output amplifiers 6 and 6a are provided in the signal processing device according to the third preferred embodiment, it is fine to have a composition in which the switch SW1 is constantly set to on and the switch SW2 is constantly set to off, as shown in FIG. 26. That is to say, by omitting the capacitor C1, the switches SW1 and SW2 and the resistor R3 of the amplifier 20 shown in FIGS. 1 and 2, it is possible to make the amplifier 20 more compact.

FIG. 27 is a state transition drawing for switches according to the ninth preferred embodiment. Similar to the amplifier 20 with which the output amplifiers 6 and 6a are provided in the signal processing device according to the fourth preferred embodiment, it is fine to have a composition in which the switch SW1 is constantly set to on and the switches SW2 and SW3 are constantly set to off, as shown in FIG. 27. That is to say, by omitting the capacitor C1, the switches SW1, SW2 and SW3 and the resistors R3 and R4 of the amplifier 20 shown in FIG. 3, it is possible to make the amplifier 20 more compact.

As explained above, with this ninth preferred embodiment, it is possible to make the amplifier 20 and the signal processing device more compact.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

This application claims the benefit of Japanese Patent Application No. 2011-135380, filed on Jun. 17, 2011, Japanese Patent Application No. 2011-153021, filed on Jul. 11, 2011, and Japanese Patent Application No. 2012-085700, filed on Apr. 4, 2012, the entire disclosures of which are incorporated by reference herein.

INDUSTRIAL APPLICABILITY

The present invention is appropriately applicable to amplifiers and signal processing deices capable of amplifying input signals containing low-frequency components.

REFERENCE SIGNS LIST

1 Direct current power source
2, 3 MR element
2a, 3a MR element
4 Channel amplifier
4a Channel amplifier
5 Channel switch
5a, 5b Channel switch
6 Output amplifier
6a Output amplifier
7 Output buffer
7a Output buffer
8 Output switch
8a Output switch
9 Channel control circuit
10 MR chip
11 ADC
12 Digital signal processor
13 Detector
14 Reading control circuit
15 Differential amplifier
16, 17 Amplifier IC
20 Amplifier
100 Sensor
201 SigIn terminal
202 Voltage follower amp
203 Inverting amplifier
204 DC feedback circuit
205 SigOut terminal
206 IC power source
207 Control circuit
C1, C2 Capacitor
Op1, Op2, Op3 Operational amplifier R1, R2, R3, R4 Resistor
SW1, SW2, SW3, SW4, SW5 Switch

The invention claimed is:

1. An amplifier comprising:
   a first resistor;
   a first operational amplifier into which an input signal is input into an inverting input terminal via the first resistor from a signal input terminal;
   a second resistor, one end of which is connected to the inverting input terminal of the first operational amplifier and the other end of which is connected to the output terminal of the first operational amplifier;
   a second operational amplifier into which a prescribed reference voltage is input into the non-inverting input terminal and the output terminal is connected to the non-inverting input terminal of the first operational amplifier;
   a first capacitor, one end of which is connected to the inverting input terminal of the second operational amplifier and the other end of which is connected to the output terminal of the second operational amplifier;
   a first switch, one end of which is connected to the inverting input terminal of the second operational amplifier and the other end of which is connected to the output terminal of the second operational amplifier;
   a third resistor and a second switch connected in series, one end of which is connected to the output terminal of the first operational amplifier and the other end of which is connected to the inverting input terminal of the second operational amplifier; and,
   a control circuit for receiving input of amp control signals and switching the first switch and the second switch on and off in a prescribed order based on the amp control signals;
   wherein through the control circuit switching the first switch and the second switch on and off in the prescribed order, the first operational amplifier amplifies the input signal with the prescribed reference voltage as a reference and an amplified signal is output from a signal output terminal connected to the output terminal of the first operational amplifier.

2. The amplifier according to claim 1, further comprising:
   a fourth resistor and a third switch connected in series, one end of which is connected to the output terminal of the first operational amplifier and the other end of which is connected to the inverting input terminal of the second operational amplifier;
   wherein the control circuit switches the first switch, the second switch and the third switch on and off in a prescribed order based on the amp control signals.

3. The amplifier according to claim 1, further comprising:
   a third switch for switching the connection between the output terminal of the first operational amplifier and the signal output terminal on and off; and
   a fourth switch, one end of which is connected between the signal input terminal and the first resistor and the other end of which is connected between the third switch and the signal output terminal;
   wherein the control circuit switches the first switch, the second switch, the third switch and the fourth switch on and off in a prescribed order based on the amp control signals.

4. The amplifier according to claim 1, further comprising:
   a fourth resistor and a third switch connected in series, one end of which is connected to the output terminal of the first operational amplifier and the other end of which is connected to the inverting input terminal of the second operational amplifier; a fourth switch for switching the connection between the output terminal of the first operational amplifier and the signal output terminal on and off; and
   a fifth switch, one end of which is connected between the signal input terminal and the first resistor and the other end of which is connected between the fourth switch and the signal output terminal;
   wherein the control circuit switches the first switch, the second switch, the third switch, the fourth switch and the fifth switch on and off in a prescribed order based on the amp control signals.

5. The amplifier according to claim 1, further comprising a second capacitor connected in parallel with the second resistor.

6. The amplifier according to claim 1, wherein the switch positioned between the output terminal of the first operational amplifier and the inverting input terminal of the second operational amplifier is a complementary switch including a P-type MOSFET (Metal-Oxide-Semiconductor Field-Effect Transistor) and an N-type MOSFET.

7. A signal processing device comprising:
   a conveyance route on which a detectable body is conveyed;
   multiple detection elements for detecting a prescribed physical quantity that changes depending on the detectable body, and outputting a detection signal the voltage of which changes in accordance with changes in the prescribed physical quantity;
   a detector for detecting entry of the detectable body into the conveyance route, and outputting a detection signal indicating the absence or presence of entry of the detectable body into the conveyance route;
   a reading control circuit for outputting an amp control signal and a channel control signal the signal levels of which change based on the detection signal;
   channel amplifiers respectively connected to the detection elements and each possessing an amplifier comprising:
   a first resistor,
   a first operational amplifier into which an input signal is input into an inverting input terminal via the first resistor from a signal input terminal,
   a second resistor, one end of which is connected to the inverting input terminal of the first operational amplifier and the other end of which is connected to the output terminal of the first operational amplifier,
   a second operational amplifier into which a prescribed reference voltage is input into the non-inverting input terminal and the output terminal is connected to the non-inverting input terminal of the first operational amplifier,
   a first capacitor, one end of which is connected to the inverting input terminal of the second operational amplifier and the other end of which is connected to the output terminal of the second operational amplifier,
   a first switch, one end of which is connected to the inverting input terminal of the second operational amplifier and the other end of which is connected to the output terminal of the second operational amplifier,
   a third resistor and a second switch connected in series, one end of which is connected to the output terminal of the first operational amplifier and the other end of which is connected to the inverting input terminal of the second operational amplifier, and a control circuit for receiving input of amp control signals and switching the first switch and the second switch on and off in a prescribed order based on the amp control signals, wherein through the control circuit switching the first switch and the second switch on and off in the prescribed order, the first operational amplifier amplifies the input signal with the prescribed reference voltage as a reference and an amplified signal is output from a signal output terminal connected to the output terminal of the first operational amplifier, the channel amplifiers each amplifying the detection signal by switching the first switch and the second switch provided in the amplifier on and off in the prescribed order based on the amp control signals, and outputting an amplified signal;

a parallel-series converter for respectively amplifying, converting to serial and outputting as a serial signal the amplified signals output by prescribed channel amplifiers based on the channel control signals;

a differential amplifier for amplifying and outputting the difference between the serial signal and a prescribed signal; and a digital signal processor for converting the output signal of the differential amplifier to a digital signal and accomplishing a prescribed signal process.

8. The signal processing device according to claim 7, wherein:

the parallel-series converter amplifies, converts to serial and outputs as the serial signal the amplified signal output by the channel amplifiers respectively connected to the detection elements containing at least a portion of the conveyance route in the detection region; and the differential amplifier amplifies and outputs the difference between the serial signal and the amplified signal output by the channel amplifiers connected to the detection element not containing any portion of the conveyance route in the detection region.

9. The signal processing device according to claim 7, wherein:

the parallel-series converter amplifies, converts to serial and outputs as the serial signal the amplified signal output by the channel amplifiers respectively connected to the detection elements containing at least a portion of the conveyance route in the detection region; and the differential amplifier amplifies and outputs the difference between the serial signal and a prescribed voltage value.

10. The signal processing device according to claim 7, wherein:

the parallel-series converter amplifies, converts to serial and outputs as the serial signal the amplified signal output by the channel amplifiers respectively connected to the detection elements containing at least a portion of the conveyance route in the detection region; and when the detection element not including any portion of the conveyance route in the detection region exists, the differential amplifier amplifies and outputs the difference between the serial signal and a prescribed voltage value or the amplified signal output by the channel amplifier connected to that detection element, and when a detection element not including any portion of the conveyance route in the detection region does not exist, the differential amplifier amplifies and outputs the difference between the serial signal and a prescribed voltage value.

11. The signal processing device according to claim 7, wherein the parallel-series converter possesses amplifiers each comprising, a first resistor, a first operational amplifier into which an input signal is input into an inverting input terminal via the first resistor from a signal input terminal, a second resistor, one end of which is connected to the inverting input terminal of the first operational amplifier and the other end of which is connected to the output terminal of the first operational amplifier, a second operational amplifier into which a prescribed reference voltage is input into the non-inverting input terminal and the output terminal is connected to the non-inverting input terminal of the first operational amplifier, a first capacitor, one end of which is connected to the inverting input terminal of the second operational amplifier and the other end of which is connected to the output terminal of the second operational amplifier, a first switch, one end of which is connected to the inverting input terminal of the second operational amplifier and the other end of which is connected to the output terminal of the second operational amplifier, a third resistor and a second switch connected in series, one end of which is connected to the output terminal of the first operational amplifier and the other end of which is connected to the inverting input terminal of the second operational amplifier, and a control circuit for receiving input of amp control signals and switching the first switch and the second switch on and off in a prescribed order based on the amp control signals, wherein through the control circuit switching the first switch and the second switch on and off in the prescribed order, the first operational amplifier amplifies the input signal with the prescribed reference voltage as a reference and an amplified signal is output from a signal output terminal connected to the output terminal of the first operational amplifier, and wherein the parallel-series converter respectively amplifies, converts to serial and outputs as the serial signal the amplified signals output by the channel amplifiers by switching the switches provided in the amplifier on and off in a prescribed order based on the amp control signals.

12. The signal processing device according to claim 7, wherein the gain of the channel amplifiers is larger than the gain of the differential amplifier and the gain of the parallel-series converter.

* * * * *